US007413280B2

(12) United States Patent
Yasuda

(10) Patent No.: US 7,413,280 B2
(45) Date of Patent: Aug. 19, 2008

(54) DETECTION METHOD OF INTERVAL OF RECORDED POSITIONS

(75) Inventor: Minoru Yasuda, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 319 days.

(21) Appl. No.: 11/294,667

(22) Filed: Dec. 5, 2005

(65) Prior Publication Data

US 2006/0132530 A1 Jun. 22, 2006

(30) Foreign Application Priority Data

Dec. 17, 2004 (JP) ............................ 2004-366266

(51) Int. Cl.
*B41J 29/393* (2006.01)
*B41J 29/38* (2006.01)
*C23C 16/52* (2006.01)

(52) U.S. Cl. ............................... 347/19; 347/16; 427/8

(58) Field of Classification Search .................. 347/19, 347/40, 15, 14, 16, 41, 42, 101, 104; 427/8, 427/9
See application file for complete search history.

(56) References Cited

U.S. PATENT DOCUMENTS 6,310,637 B1 * 10/2001 Shimada et al. ............... 347/19
6,419,342 B1 * 7/2002 Bronswijk et al. ............ 347/19
6,467,870 B2 * 10/2002 Matsumoto et al. ........... 347/19
6,655,771 B2 * 12/2003 Matsumoto et al. ........... 347/13
6,714,748 B1 * 3/2004 Nakayasu et al. ............. 399/72
6,948,793 B2 * 9/2005 Bronswijk et al. ............ 347/19
7,213,900 B2 * 5/2007 Ebihara ....................... 347/19

FOREIGN PATENT DOCUMENTS

JP 10-115955 5/1998
JP 2002-079657 3/2002
JP 2002-096462 4/2002
JP 2003-170645 6/2003

* cited by examiner

*Primary Examiner*—Stephen D. Meier
*Assistant Examiner*—Rene Garcia, Jr.
(74) *Attorney, Agent, or Firm*—Lucas & Mercanti, LLP

(57) ABSTRACT

A method for detecting an interval of recorded positions, including the steps of recording a first pattern group in such a way that the recording heads scan a recording medium so that recording elements record a pattern having repeatedly dark density area and light density area perpendicular to a scanning direction of the recording head, recording a second pattern group in such a way that the recording heads scan the recording medium so that recording elements record a pattern having repeatedly dark density area and light density area perpendicular to a scanning direction of the recording head and further the second pattern group is overlapped on and angled to the first pattern group, detecting interference fringes generated by overlap of the first pattern group and the second pattern group, and detecting a change of the interval of the recorded positions via a positional deviation of the interference fringes.

11 Claims, 21 Drawing Sheets

FIG. 2 ( a )
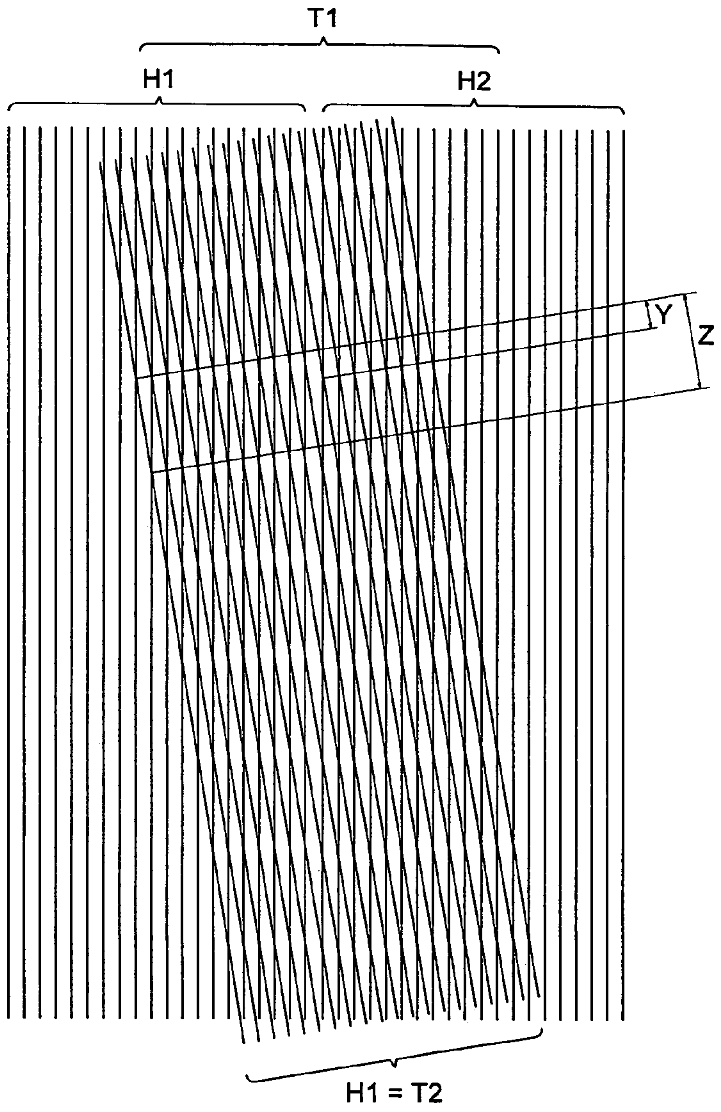
FIG. 2 ( b )
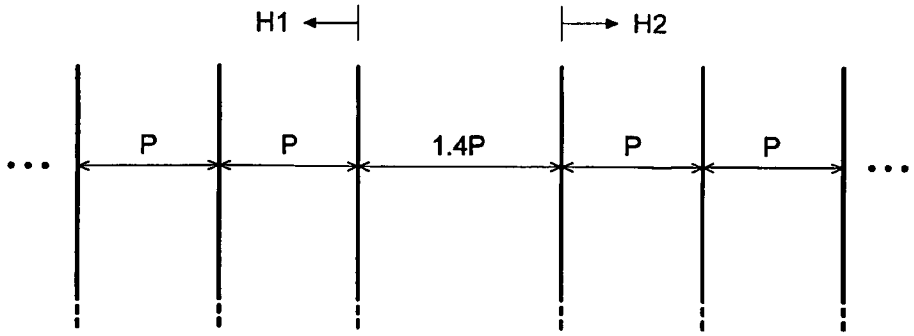

FIG. 5 ( a )
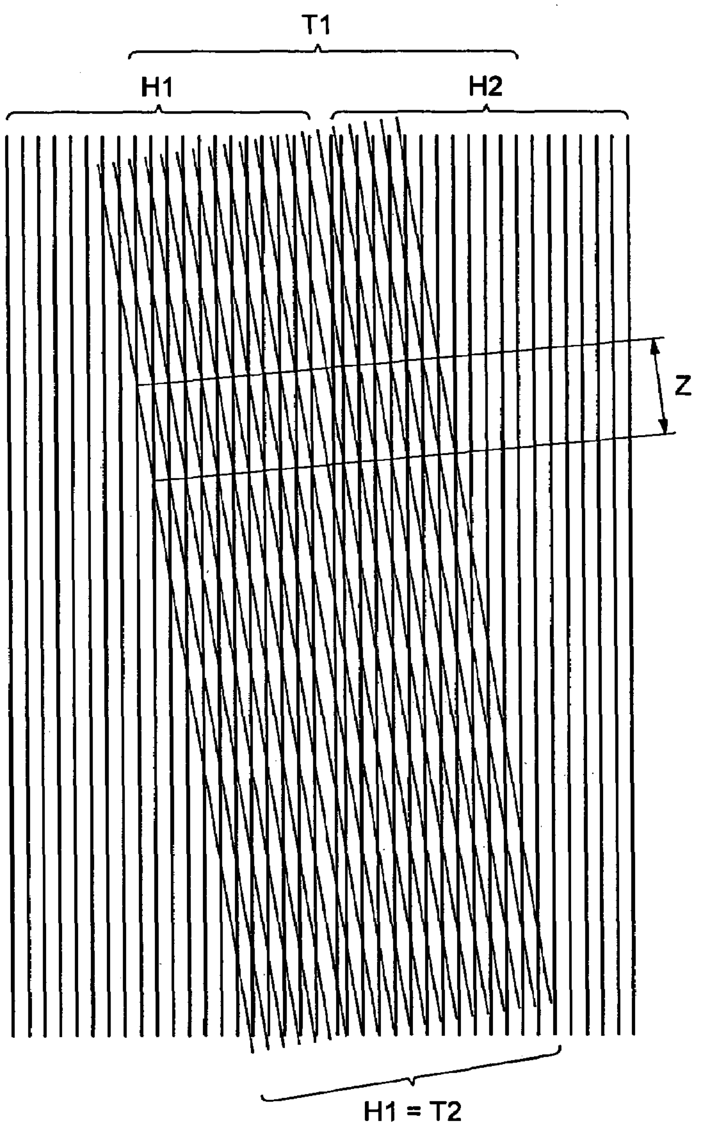
FIG. 5 ( b )
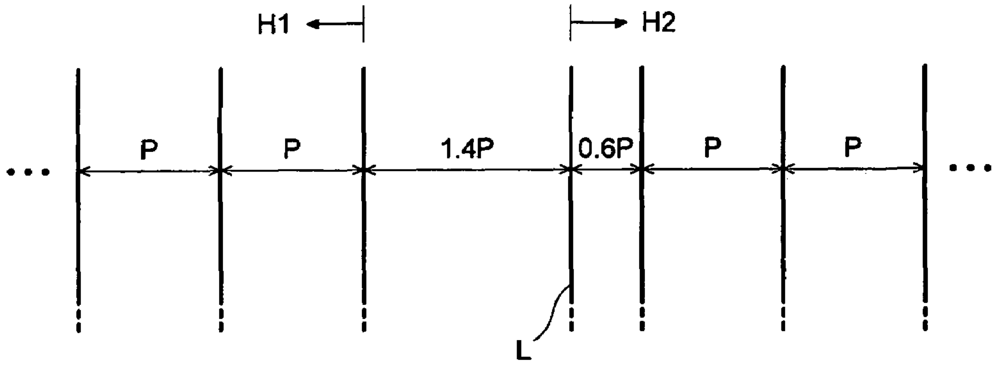

FIG. 15 ( a )
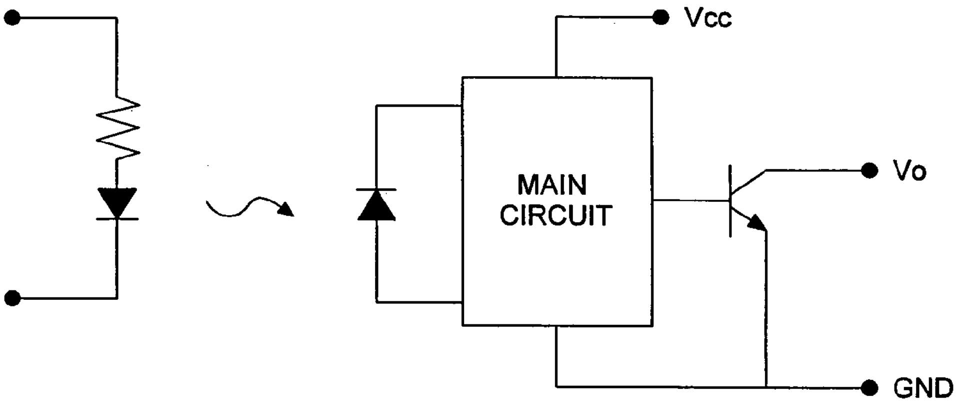
FIG. 15 ( b )
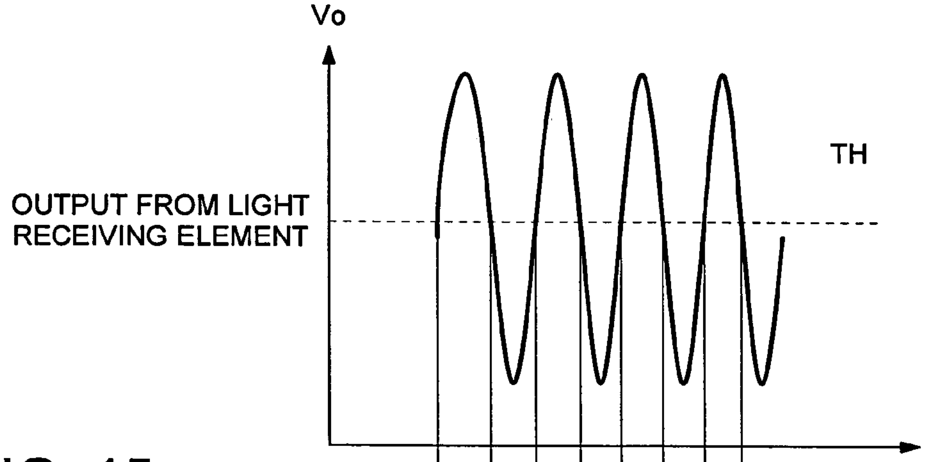
FIG. 15 ( c )
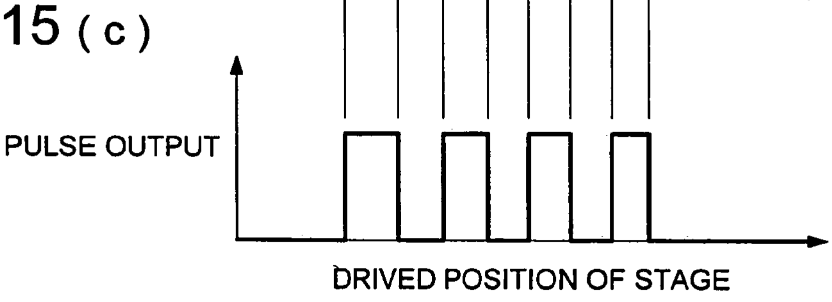

FIG. 20 ( a1 )
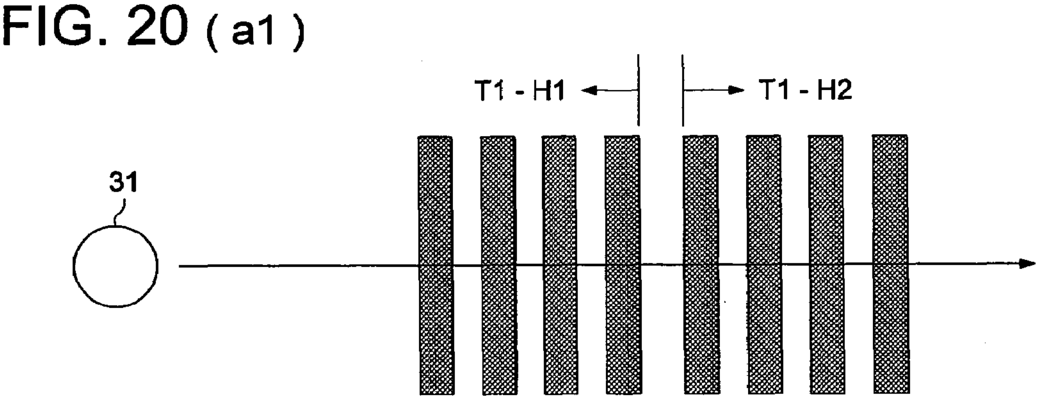
FIG. 20 ( a2 )
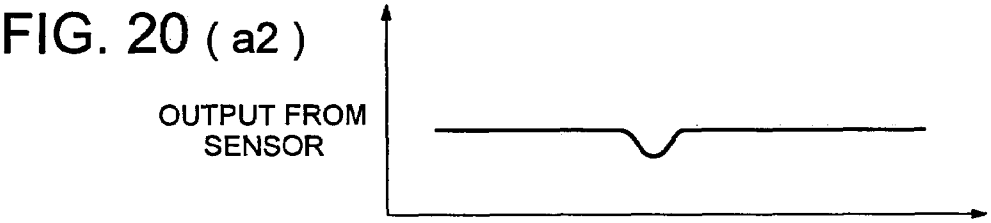
FIG. 20 ( b1 )
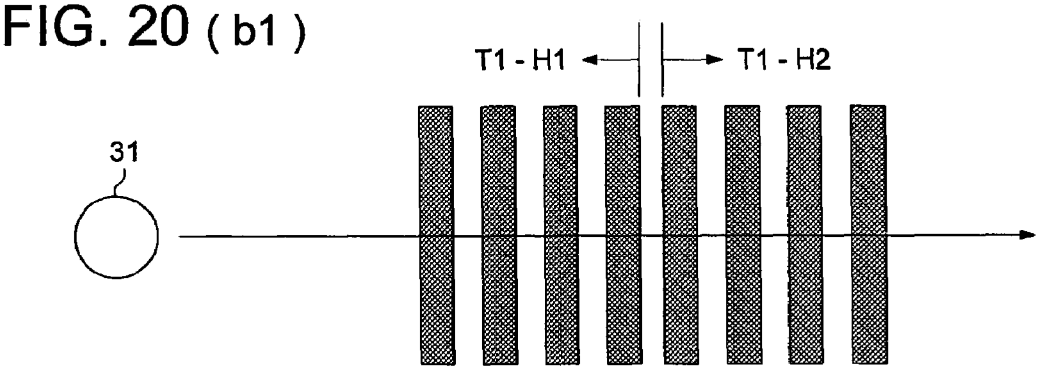
FIG. 20 ( b2 )

DETECTION METHOD OF INTERVAL OF RECORDED POSITIONS

This application is based on Japanese Patent Application No. 2004-366266 filed on Dec. 17, 2004 in the Japanese Patent Office, the entire content of which is hereby incorporated by reference.

BACKGROUND OF THE INVENTION

The present invention relates to a detection method of the interval variation of recorded positions printed by plural recording elements.

Recently, as in an inkjet recording head in which plural nozzles are aligned, used is a recording head in which plural recording elements are aligned. A single recording head is used, or the plural heads are aligned and used to increase the scanning width. These recording elements function as an element which prints a minimum unit of a printed image, similar to the nozzle of an inkjet printer.

Whichever may be used, whether a single recording head or plural aligned recording heads, high uniformity of the interval pitch of the recorded positions printed by the recording elements is required for the targeted quality of printed matters.

The uniformity of pitch of the positions recorded by the recording elements of the single head depends upon the manufacturing accuracy of the recording head. For example, when the recorded positions of each recording element in the single head vary about "±a" μm compared to the ideal position, and an ideal pitch interval is "P" μm, then the interval of the recorded position printed by said head is set within (P±a) μm.

When the plural recording heads are aligned for use, the high uniformity of pitch, including any joints of adjacent recording heads, is very important not only for the print targeting high dimensional printing accuracy, but also for industrial production wherein colored materials of a liquid-crystal color filter or a light emitting element of an organic EL is precisely coated within a microscopic cell. When the plural recording heads are aligned, the accuracy of the pitch between adjacent recording heads depends upon the configurational accuracy of the recording heads. Therefore, detection methods of the relative position of the recording heads have been recently proposed.

In the invention of Patent Document 1, the recording heads are positioned to overlap each other so that several nozzles on both ends of the recording head are subjected to print a pattern, and thereby, the relative position of the adjacent recording heads were detected.

In the invention of Patent Document 2, the recording heads are positioned to overlap each other so that as a sensor reads an image, the relative position of the adjacent recording heads were detected.

The invention of Patent Document 3 concerns a technology to detect inclination of the recording head in the main scanning direction, while the invention of Patent Document 4 concerns a technology to detect parallelism of plural spliced recording heads, which cannot detect the pitch of the recorded position on a joint of adjacent recording heads.

[Patent Document 1] JP-A 2002-79657

[Patent Document 2] JP-A 2002-96462

[Patent Document 3] JP-A 10-115955

[Patent Document 4] JP-A 2003-170645

The problems described below were noted in the above-mentioned conventional technologies.

Now, a simplified model, shown in FIGS. 6-8, is being studied. In FIG. 6, recording elements n1-n7 are aligned in recording head H1, while recording elements n8-n14 are aligned in recording head H2. Recording elements n1-n14 (total 14 elements) are arranged at an equal pitch in perpendicular direction to main scanning direction X. The pitch being studied is evaluated based on the recorded position on a recording media. For example, when the recording element is a nozzle, the pitch is evaluated based on the deposited position of ink droplets jetted from the nozzles onto the recording media, and not evaluated for the aligned pitch of the nozzles themselves. FIG. 6 shows the ideal condition in which recorded patterns 1-14 are printed by recording elements n1-n14 at equal pitch P.

Next, the case in FIG. 7 will be discussed. Recorded pattern 8 is deviated toward recorded pattern 9 by distance "a" compared to the ideal pitch line (shown by a dotted line), while recorded pattern 14 deviates in the opposite direction by distance "a".

If the positional deviations shown in FIG. 7 are detected by the invention of Patent Document 1 or 2, deviated amount "a" is detected as the relative position of the adjacent recording heads, therefore, recording heads H1 and H2 are to be repositioned with the gap between recording heads H1 and H2 reduced by "a" as shown in FIG. 8. Then, recorded patterns 9-13 recorded by recording head H2 are deviated by distance "a" from the ideal pitch patterns (shown by the dotted lines). Accordingly, recorded pattern 14 is deviated from the ideal pitch pattern by distance "2*a*". This is because the relative position of the adjacent recording heads is decided based on recorded pattern 8 being deviated at distance "a" as a specific characteristic of the recording head, and thereby, the positions of recorded patterns 9-14 via recording elements n9-n14 are additionally deviated by distance "a".

In a case that the positions of each of recorded patterns 1-14 are optionally varied within the scope of "P ±a" μm, the maximum error of "2*a*" is generated by the reposition the recording head. Further, it is understood that any one of the recorded patterns may have an error greater than "a". This means that when there is an allowable error of ±"a" μm, even though the formation of each recording head are within the allowable error, the error, being greater than the allowable error of the recording heads, is generated by defective positioning process of the recording heads.

This error may not have a large negative influence on the image quality during printing, however, in the case that a material is given within a microscopic area, as in the case that color materials of a liquid-crystal color filter or a light emitting element of an organic EL is positively coated within a microscopic cell, deformities may be generated such as an "image dropout", which cannot satisfy the desired quality.

In FIGS. 6 and 7, recording heads H1 and H2 are used on for explanation, but if the number of the recording heads is increased to H1, H2, H3 - - - (each is not illustrated), which would of course increase the number of arrays of the recording elements, whereby the error at subsequent joints accumulates, and recording elements of the recording head at the far end may be positioned by a deviated amount far greater than "2a".

Accordingly, the more the number of recording heads which are combined, the more difficult is to satisfy the desired characteristic, being unable to satisfy the required quality.

Further, if the detection of positional deviation shown in FIG. 8 is tried by the invention of Patent Document 1 or 2, it is not possible to detect deviated amount "a" of recorded patterns 9-13, which are not targeted, nor deviated amount "2*a*" of recorded pattern 14 at the end, not being a joint.

According to the conventional art in which the sensor is employed for the detection, in order to adjust the recorded positions recorded by each recording element within the tolerance, each error of the recorded positions recorded by each recording element must be detected.

In addition, in order to reduce the pitch, the recording elements of each recording head may be arranged at an angle in scanning direction X as shown in FIG. 9, however, this case also has the same problem as mentioned above.

The present invention has been achieved in view of the above-cited conventional technology. A target of the present invention is to provide the method which is able to easily detect all of the interval changes of the recorded positions which are recorded by plural arrays of recording elements, each structured in a recording head, as well as the recording apparatus which is able to detect the interval of recorded position recorded by the plural recording heads mounted therein.

SUMMARY OF THE INVENTION

The problem described above can be solved by Structures enumerated below.

Structure 1

A method for detecting the change of the positional interval recorded by plural recording elements arrays each structured in a single recording head, including the steps of a first recording operation for recording a first recorded pattern group, wherein all recording elements structuring the recording elements array or recording elements alternatively selected at a predetermined interval from the recording elements arrays, existing in the plural recording heads, are operated to scan a recording medium in a predetermined direction and record a first printed pattern group having dark density area and light density area, repeatedly printed perpendicular to the scanning direction, based on the operation of the recording elements, and a second recording operation for recording a second recorded pattern group, wherein the recording elements arrays existing in the plural recording heads, or all recording elements or recording elements alternatively selected at a predetermined interval from the recording elements arrays, structuring the recording elements array in a single recording head, are operated to scan a recording medium in a predetermined direction and record a second printed pattern group having dark density area and light density areas repeatedly printed perpendicular to the scanning direction, based on the operating recording elements, wherein one of the first or second printed pattern group is printed perpendicular to the scanning direction of the recording operation, being a first recording operation, and on which another printed pattern is overlapped and printed not perpendicular to the scanning direction of the recording operation, being a second recording operation, and thereby interference fringes are generated by the overlap of the first and second recorded pattern groups, wherein the positional deviation of the interference fringes can be detected as a change of interval of the recorded position.

Structure 2

The method for detecting the recorded positional interval described in Structure 1, wherein a line is recorded by a single recording element in the first printed pattern group and also in the second printed pattern group, and thereby plural, parallel, lines are generated based on the number of the recording elements in operation.

Structure 3

The method for detecting the recorded positional interval described in Structure 1 or 2, wherein the second recording operation is carried out by a single recording head.

Structure 4

The method for detecting the recorded positional intervals described in Structures 1-3, wherein the ratio of the deviated amount of interference fringes corresponding to a single pitch of the interference fringes is detected as the ratio of the change of recorded positional interval corresponding to a single pitch of the recorded positions.

Structure 5

A recording apparatus, including plural recording heads having therein a recording elements array structured of plural recording elements, a recording operation control section by which a first recording operation for recording a first pattern group in such a way that all recording elements structuring the recording elements array or recording elements alternatively selected at a predetermined interval from the recording elements arrays, existing in the plural recording heads, are conducted to scan a recording medium in a predetermined direction and record a first pattern group having dark density area and light density area, repeatedly printed perpendicular to the scanning direction, based on the operation of the recording elements, and by which a second recording operation for recording a second pattern group in such a way that the recording elements arrays existing in the plural recording heads, or all recording elements or recording elements alternatively selected at a predetermined interval from the recording elements arrays, structuring the recording elements array in a single recording head, are conducted to scan a recording medium in a predetermined direction and record a second pattern group having dark density area and light density areas repeatedly printed perpendicular to the scanning direction, based on the operating recording elements, wherein one of the first or second pattern group is printed perpendicular to the scanning direction of the recording operation, being a first recording operation, and on which another printed pattern is overlapped and printed not perpendicular to the scanning direction of the recording operation, being a second recording operation, and an interference fringes detecting means for detecting the positions of the interference fringes generated by angled overlapping of the first pattern group and the second pattern group.

In addition, "detecting the positions of interference fringes" means to obtain numerical information of the position of the areas having a density greater than a predetermined density on the recording medium. This means to obtain numerical information of the position of interference fringes on the recording medium, numerical information of the position of peaks of "dark" or "light", and numerical information of the position of a predetermined intermediate density. Though the peaks of "light" are more visible, every peak can be used for detection.

Structure 6

The recording apparatus described in Structure 5, wherein the interference fringes detecting means detects the position of interference fringes at plural different positions in the directions of interference fringes.

Structure 7

The recording apparatus described in Structure 5, wherein the interference fringes detecting means detects the position of interference fringes generated by overlapping of the first pattern recorded by a certain recording head and the second pattern, and the position of interference fringes generated by overlapping of the first pattern recorded by another certain recording head adjacent to the certain recording head and the second pattern.

Structure 8

The recording apparatus described in Structure 7, further including a position adjusting device which adjusts the position of the recording head based on positional information detected by the interference fringes detecting means.

Structure 9

The recording apparatus described in Structures 5-8, wherein the interference fringes detecting means includes a sensor being able to detect variation of dark and light density of interference fringes, a scanning means for making the sensor to scan the recording medium in the main scanning direction and the sub-scanning direction, an encoder which outputs relative moving distance of the sensor and the recording medium scanned by the sensor at a predetermined encoder resolution, and a means for calculating the position of interference fringes, wherein said means creates numerical information of the position of interference fringes.

BRIEF DESCRIPTION OF THE DRAWINGS

FIG. 2(*a*) is an example of the recorded pattern formed by the present invention, showing the interference fringes.

FIG. 2(*b*) shows the pitches of the patterns recorded by the jointed section of the heads.

FIG. 4(*b*) shows the pitch of the patterns printed by the jointed section of the heads.

FIG. 5(*a*) is still another example of the recorded pattern formed by the present invention.

FIG. 5(*b*) shows the pitches of the patterns printed by the jointed section of the heads.

FIG. 15(*a*) is a circuit diagram including a photo sensor and a photo sensor light receiving amplifier.

FIG. 15(*b*) shows a wave form of the outputted signal from the amplifier.

FIG. 15(*c*) shows a pulse wave form outputted from a pulse generating circuit.

FIG. 20(*a*1) and (*b*1) are plan views showing a photo sensor perpendicularly scanning the first pattern.

FIG. 20(*a*2) and (*b*2) are the wave forms outputted from the photo sensor

DETAILED DESCRIPTION OF THE PREFERRED EMBODIMENTS

Figure 1:
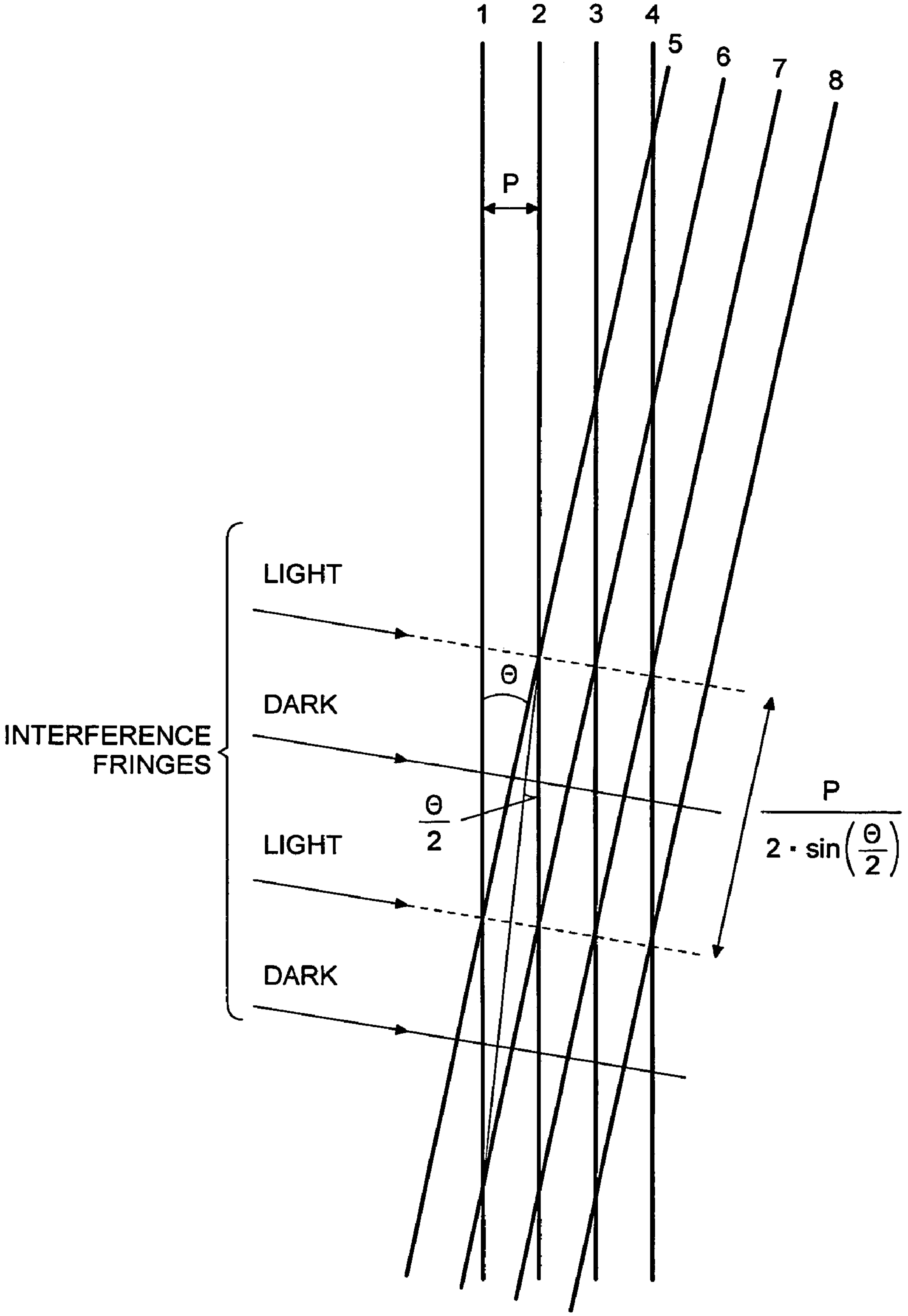
FIG. 1 shows a recorded pattern to explain the principle of the present invention.

The principle of the present invention will be explained below referring to the embodiments.

In order to realize the present method, the first and second recorded pattern groups must exhibit the repetition of high and low density areas, based on the activated recording elements, being perpendicular to the scanning direction, being for example, the patterns of the parallel straight lines. If they are the parallel straight lines, being the solid lines, the interference fringes appear in a most obvious way, whereby the positional deviation of the interference fringes can be easily detected. The parallel dotted straight lines can also create interference fringes. If a pattern group has the lines formed of dispersed dots and has the repetition of the high and low densities based on the activated recording elements, and further the pattern group is perpendicular to the scanning direction, the interference fringes appear so that the change of interval of the printed position can be detected via the positional deviation of the interference fringes. However in the case of dotted lines or lines of the dispersed dots, the larger the non-printed white area in the scanning direction, the less visible the interference fringes. Accordingly, the most readable are parallel straight solid lines, exhibiting no white areas in the scanning direction, but having the highest contrast of the high and low density, and printed perpendicular to the scanning direction.

When recording is carried out by all of the recording elements structuring the recording elements array under the predetermined conditions, if there is no clearance between the area recorded by the recording elements adjacent to each other, and no change of density, it is not possible for the recording elements to create the recorded pattern exhibiting repetition of the high and low densities based on the operating recording elements in the scanning direction, whereby the present invention cannot be realized. In this case, if it is possible to change a recorded line width (which is the diameter of a single dot, for example) recorded by a single recording element, the recorded width of the single recording element is reduced so that a space or light density area can be created between a recorded pattern of a single recording element and the recorded pattern of its adjacent recording elements, and further, a space or light density area can be created via operating the recording element alternately selected at a predetermined interval (for example, every other element). In order to more clearly create the interference fringes, a space having no density, and not being a low density area, is preferably used, however if there is any low density area between high density areas, interference fringes are generated. Yet further, when the recording elements are operated alternatively and selected at a predetermined interval, it is possible to detect the changes of the recorded position via the selected and activated recording elements, due to the interference fringes.

In the present invention, the printing order of the first and second printed patterns does not matter. If both of the first and second printed patterns are overlapped at an angle, but not being perpendicular, interference fringes are generated. Accordingly, it is essential that the scanning direction of the first and second recording operations should be angled relative to each other, but not being perpendicular. The crossing angle of the first and second recorded patterns cannot be perpendicular, since if they are perpendicular, no interference fringes are generated.

FIG. 1 explains the interference fringes which appear when two groups of parallel solid line patterns are overlapped at angle θ. Individual lines are represented by numerals 1-8. The pitch between adjacent lines is represented by "P". When lines 5-8 are angled against lines 1-4, the white areas increase and "light" sections become larger, being the peak of light section, while the area in which lines 1-8 are most widely separated is the peak of "dark" sections. Then the interference fringes appear including the peak of "light" sections (see FIGS. 2-5). In addition, FIGS. 2-5 show the patterns magnified twentyfold of the real recorded patterns. If the interference fringes are not visible to you, view them from a distance.

In FIG. 1, the conceptual pitch of the interference fringes is represented by $P/\{2 \sin(\theta/2)\}$. To more easily read out the deviated amount of the interference fringes, it is preferable to increase value $P/\{2 \sin(\theta/2)\}$. For this purpose, it is necessary to reduce θ (0°<θ<90°), that is, the crossed angle of the patterns needs to be reduced.

In FIG. 2(*a*), first recorded pattern T1 is printed as parallel solid lines by recording heads H1 and H2, and second recorded pattern T2 is overlapped and printed by angled recording head H1 on first recorded pattern T1. In FIG. 2 (*a*), the interval of the lines recorded by each recording head is represented as an equal pitch (being an ideal pitch "P"). Further, the interval of the recorded positions adjacent to each other between recording heads H1 and H2 is 1.4 P. Accordingly in FIG. 1(*a*), the fringes in the overlapped areas of recording heads H1 and H2 are deviated downward by 0.4 pitches of interference fringes, from the fringes in the overlapped areas of recording heads H1 themselves. The deviated amount is shown by "Y" (In FIGS. 2,3 and 4).

In the embodiment of the present invention, firstly, recording heads H1 and H2 are positioned so that the interval of the recorded positions via recording heads H1 and H2 can be set within the scope of (P±0.5 P), next, recording heads H1 and H2 carry out their printing operation, whereby the recorded pattern shown in FIG. 2(*a*) becomes visible.

In addition, one of first recorded pattern T1 and second recorded pattern T2 is firstly printed so that they overlap each other. In order to operate the recording apparatus at an angle, but which is short of being perpendicular, between the scanning direction of the first recording operation and the scanning direction of the second recording operation, the recording medium is introduced into the recording apparatus at an angle between the first recording operation and the second recording operation, that is, the recording apparatus is not set at a different condition.

Next, in FIG. 2, positional deviation amount Y of the interference fringes against pitch Z of the interference fringes is visually detected or, with the aid of a magnifying glass if necessary.

In the case of FIG. 2(*a*), the detected value is +0.4.

Next, the interval between recording heads H1 and H2 is reduced by 0.4 P.

Accordingly, the total arrangement of the recording elements structured of recording Heads H1 and H2 can be controlled to an equal pitch.

Figure 3:
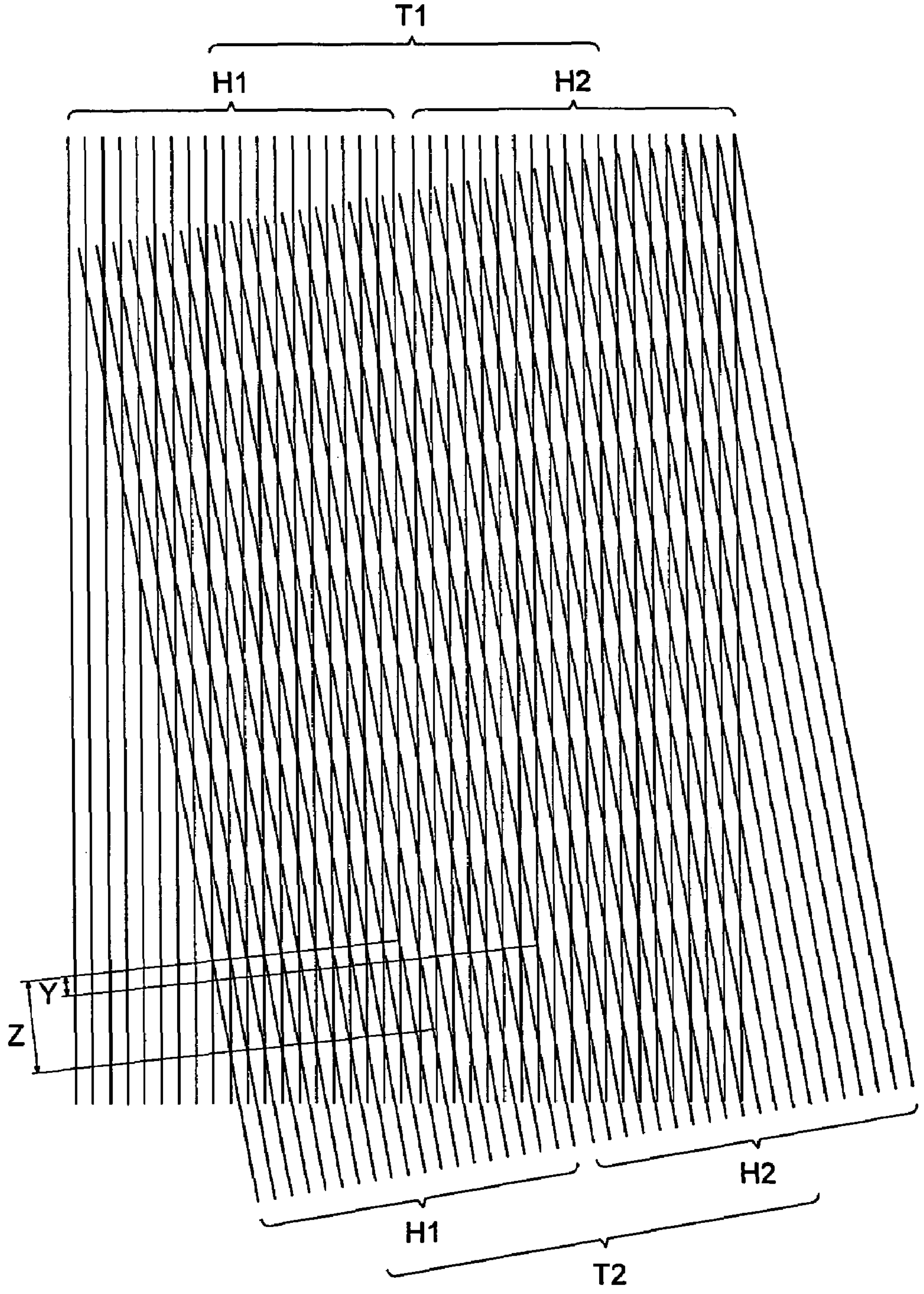
FIG. 3 is yet another example of the recorded pattern formed by the present invention.

In FIG. 3, second recorded pattern T2 is recorded by recording heads H1 and H2, while the other conditions are the same as those of FIG. 2(*a*). Deviated amounts can also be detected in the recorded patterns in FIG. 3, but since symmetrical boundary sections are generated, the measurement must be carried out carefully.

In practice, in arrangement of the recording elements for recording, slight variation can always be detected by accurate measurement. Accordingly, after a recording head is specified for printing recorded pattern T2 to overlap first recording patter T1, specified is a way of said variation of the arrangement of the recording elements for recording second recorded pattern T2, and thereby, the measurement of the positional deviation of the interference fringes is carried out without any problem. As a result, the measurement error of the positional deviation of the interference fringes is greatly reduced. Further, if any single recording head, having higher accurate arrangement of the recording elements for recording second recorded pattern T2, can be selected, the measurement error of the positional deviation of the interference fringes is also greatly reduced. In order to select a recording head having a more accurate arrangement of the recording elements, one of the effective methods is to select a recording head having more straight interference fringes in an area in which the head, being the same one, is overlapped.

Figure 4:
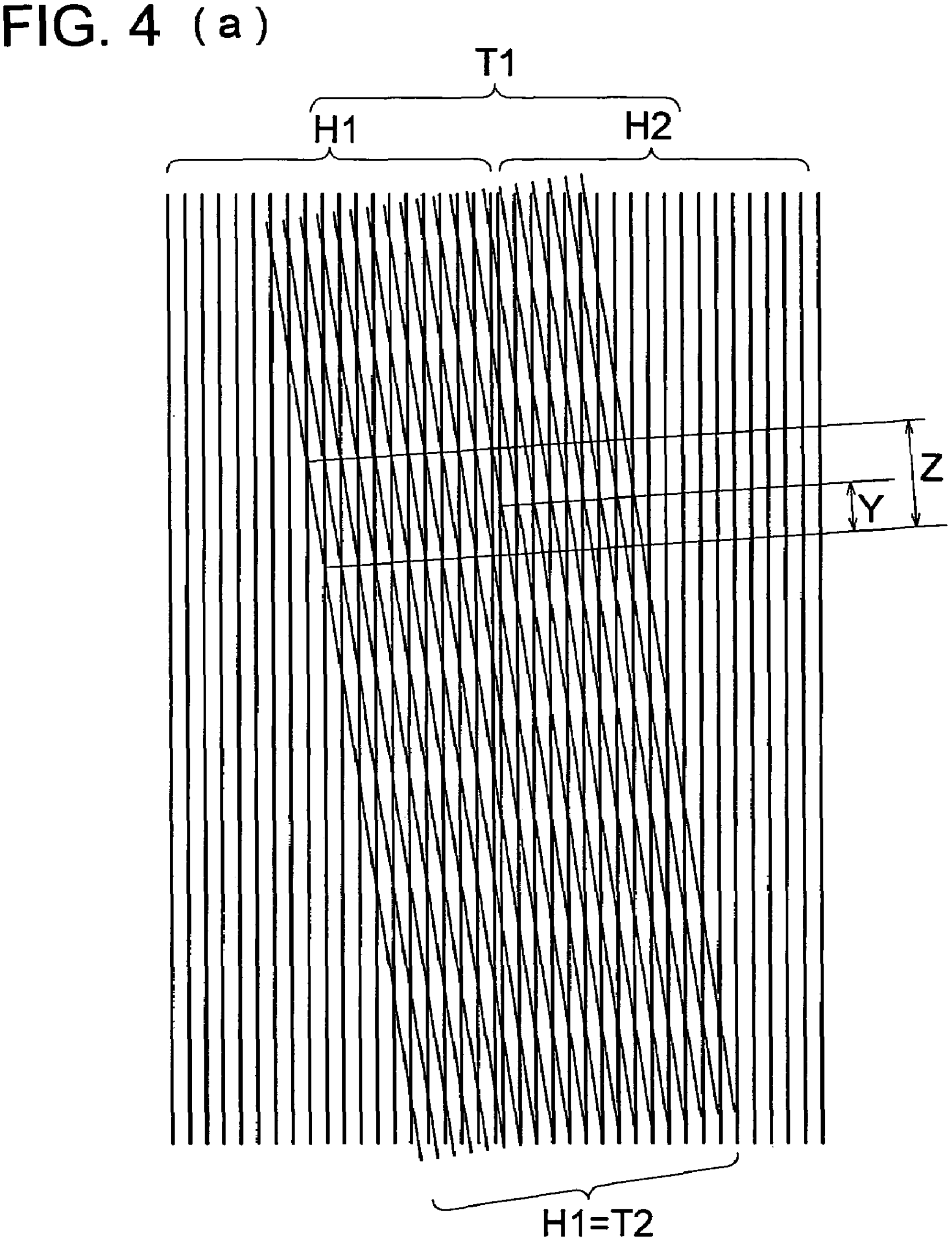
FIG. 4(*a*) is still another example of the recorded pattern formed by the present invention, showing interference fringes.
Figure 4:
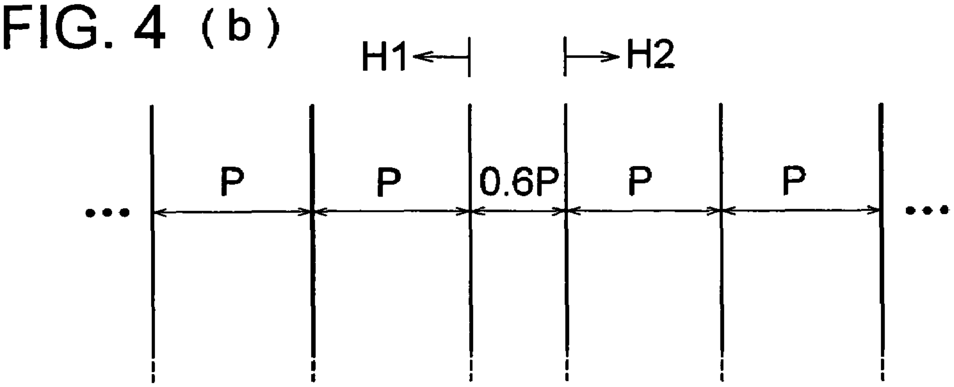

FIG. 4 shows patterns wherein first recorded pattern T1 is recorded by recording heads H1 and H2 as the parallel straight lines, after which the recording medium is angled and second recorded pattern T2 is printed by recording head H1 overlapped on the recorded pattern T1. The interval between the recorded positions by each recording head is equally spaced as pitch "P", and the interval of the adjacent recorded positions between recording heads H1 and H2 is 0.6 P. In the case of FIG. 4, the fringes in the overlapped areas of recording heads H1 and H2 are deviated upward by 0.4 pitches of the interference fringes, from the fringes in the overlapped areas of recording heads H1 themselves.

In the embodiment of the present invention, firstly, recording heads H1 and H2 are positioned so that the interval of the recorded positions via recording heads H1 and H2 can be set within the scope of (P±0.5 P), next, recording heads H1 and H2 carry out their printing operation, and the recorded pattern shown in FIG. 4 is printed.

Next, the positional deviation amount of the interference fringes to the pitch of the interference fringes is visually detected or, with the aid of a magnifying glass if necessary.

In the case of FIG. 4 (*a*), the detected value is −0.4.

Next, the interval between recording heads H1 and H2 is enlarged by 0.4 P.

Accordingly, the total arrangement of the recording elements structured in recording heads H1 and H2 can be controlled to an equal pitch.

FIG. 5 shows the patterns wherein first recorded pattern T1 is recorded by recording heads H1 and H2 as the parallel straight lines, after which the recording medium is angled and second recorded pattern T2 is printed by recording head H1 overlapping recorded pattern T1. The interval between the recorded positions by each recording head H1 is equally spaced as pitch "P", and the interval of the recorded position, most adjacent to recording head H1, via recording head H2 is 0.6 P, and further the interval between the recorded positions adjacent between recording heads H1 and H2 is 1.4 P (see FIG. 5(*b*)).

In the case of FIG. 5(A), the fringes in the overlapped areas of recording heads H1 and H2 is totally on the same lines as the fringes in the overlapped areas of recording heads H1 themselves. However, a boundary section is generated on the fringes on recorded line L [see FIG. 5(*b*)] existing at an end portion of recording head H2, adjacent to the recording head H1 side, and further, the line of the interference fringes is not a perfect one so that the pitch of the recorded position on the joint between recording heads H1 and H2 is deteriorated.

In the embodiment of the present invention, if the interference fringes as shown in FIG. 5(*a*) appear, methods (1)-(3) described below will be carried out. That is, Method (1): If it is acceptable, employ without change.

Method (2): If it is not acceptable, adjust the interval between recording heads H1 and H2 to improve straightness and continuity of the total fringes, and thereby, the total arrangement of the recording elements becomes acceptable.

Method (3): If it is not acceptable, and not adjustable to an acceptable level by Method (2), change recording head H2, and try once more to check and measure the interference fringes via recording the pattern of the present invention.

Figure 6:
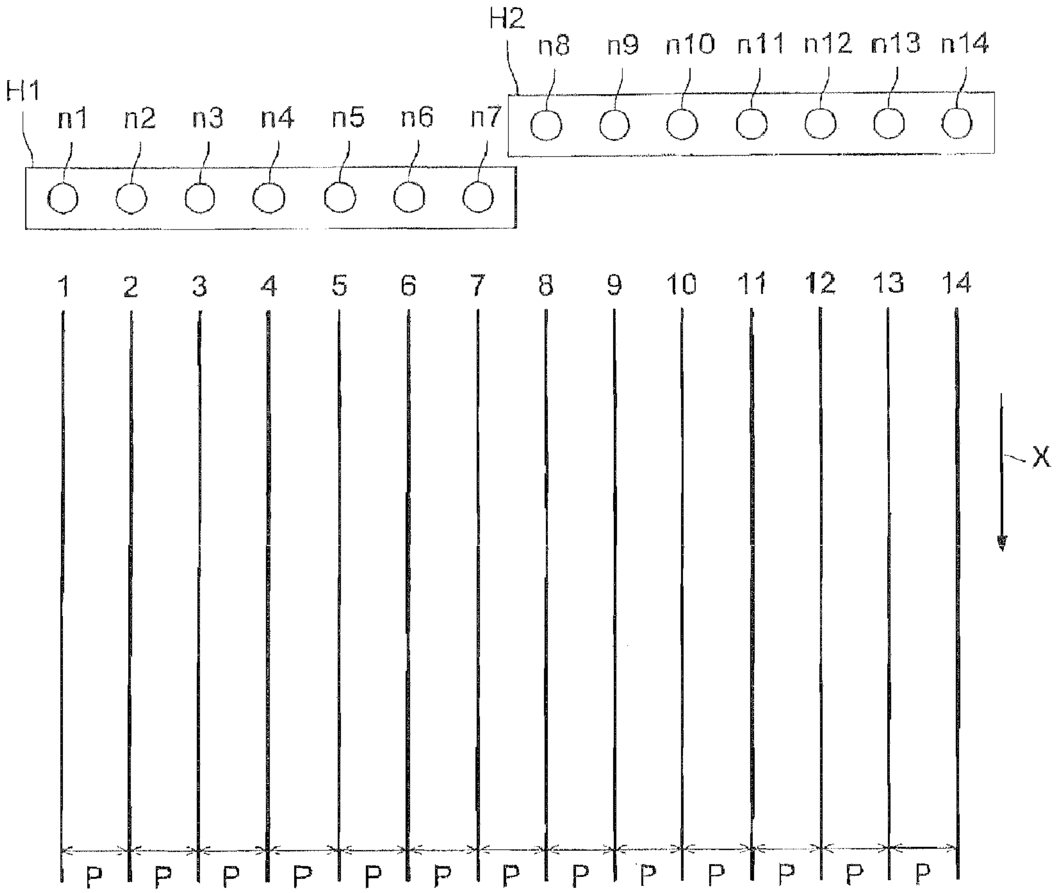
FIG. 6 PRIOR ART
FIG. 6 is a simplified model (1) to explain the problem in the prior art.
Figure 7:
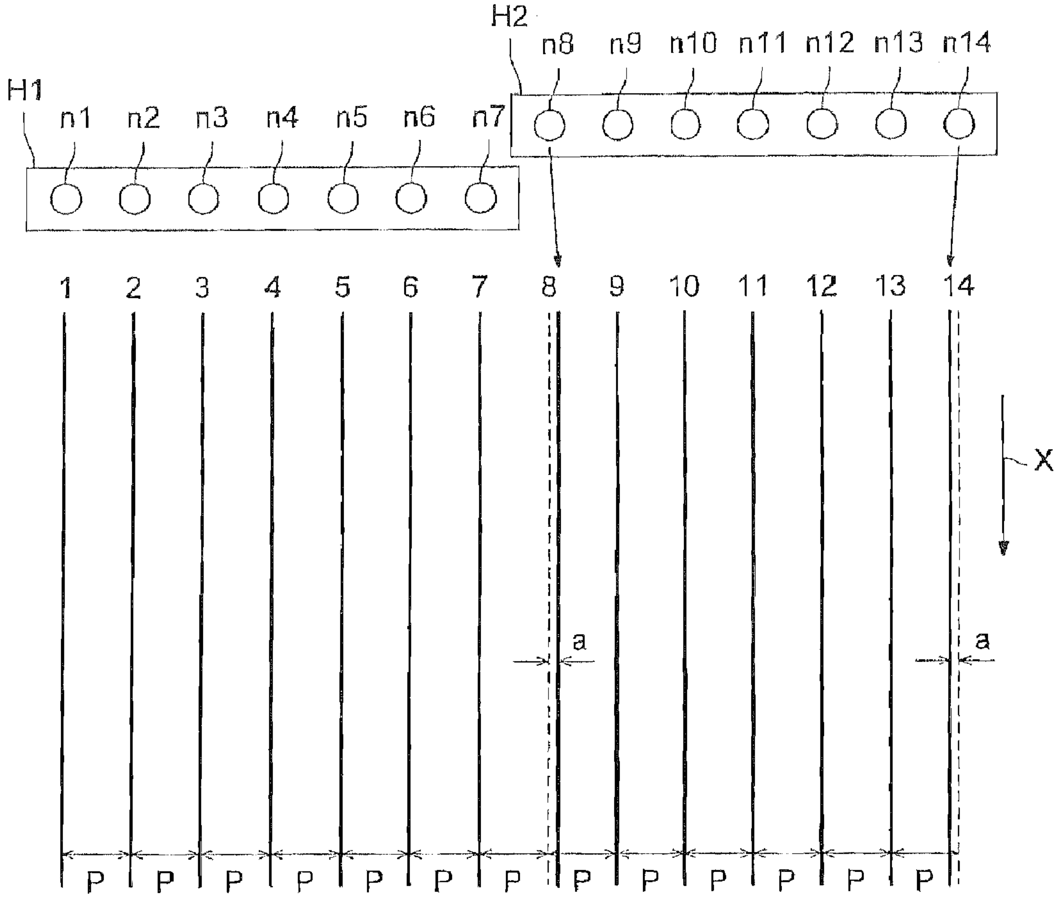
FIG. 7 PRIOR ART
FIG. 7 is a simplified model (2) to explain a problem in the prior art.
Figure 8:
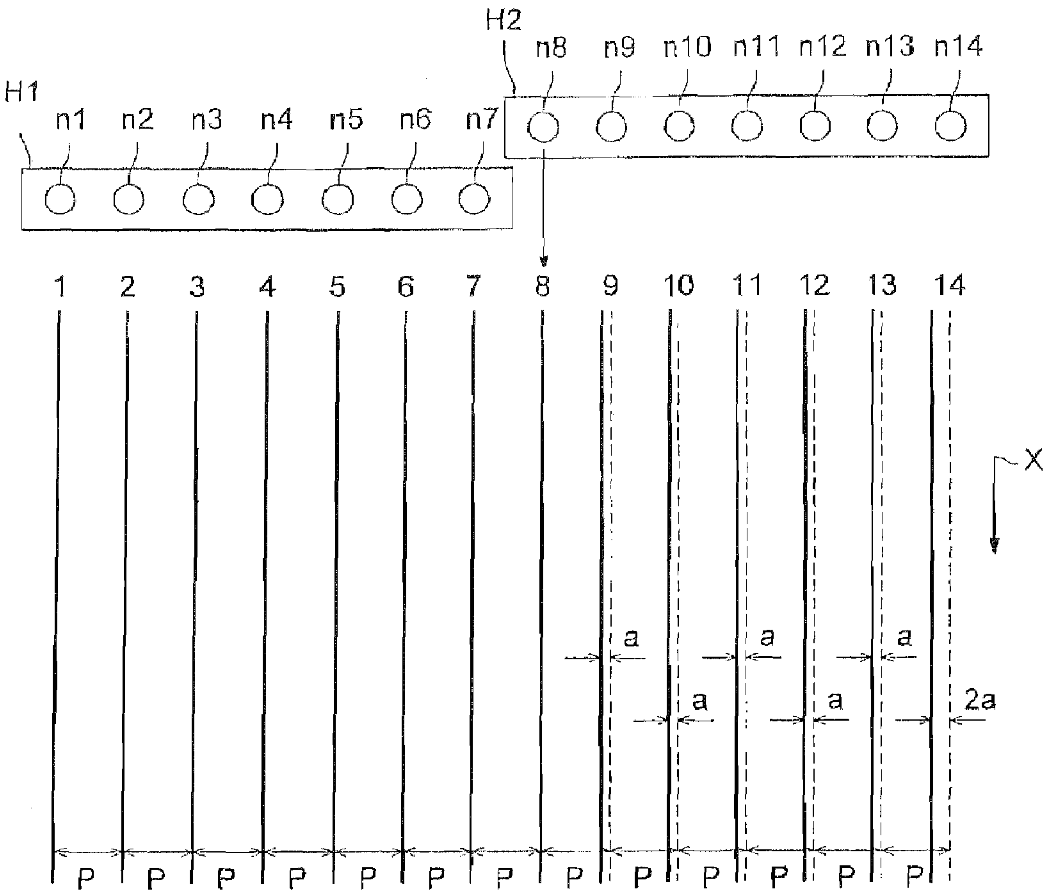
FIG. 8 PRIOR ART
FIG. 8 is yet another simplified model (3) to explain a problem in the prior art.
Figure 9:
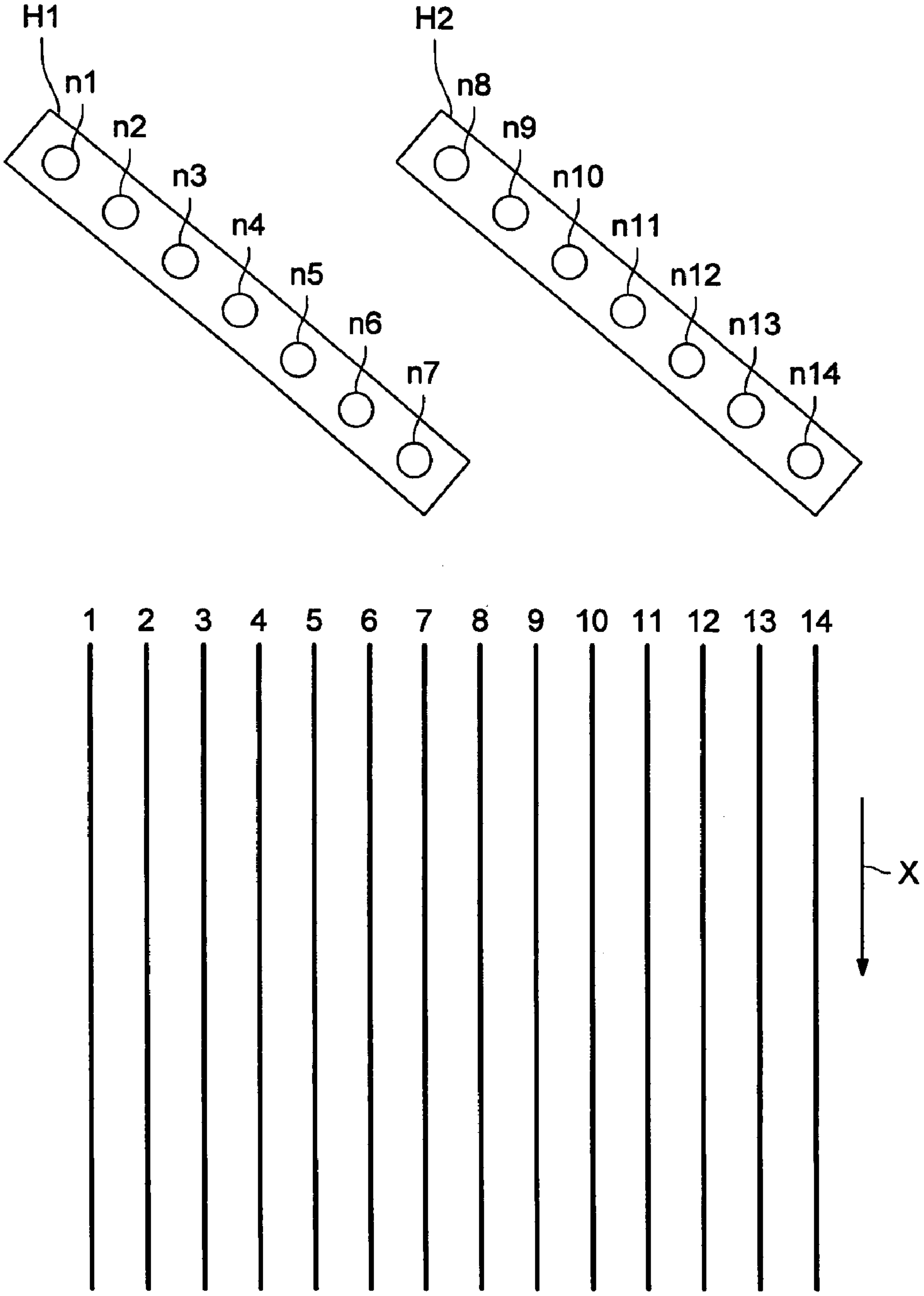
FIG. 9 shows the recording heads placed in angle and their recorded patterns.

In addition, the recording heads are not illustrated in FIGS. 1-5, but in the present invention, it is possible to employ a structure wherein the arrangement of recording elements in the recording head is perpendicular to scanning direction X as shown in FIGS. 6-8, yet further, it is also possible to employ a structure wherein the arrangement of recording elements in the recording head is angled to the scanning direction X as shown in FIG. 9.

Next, an embodiment of the present method will be explained, referring to an example of the recording apparatus.

Figure 10:
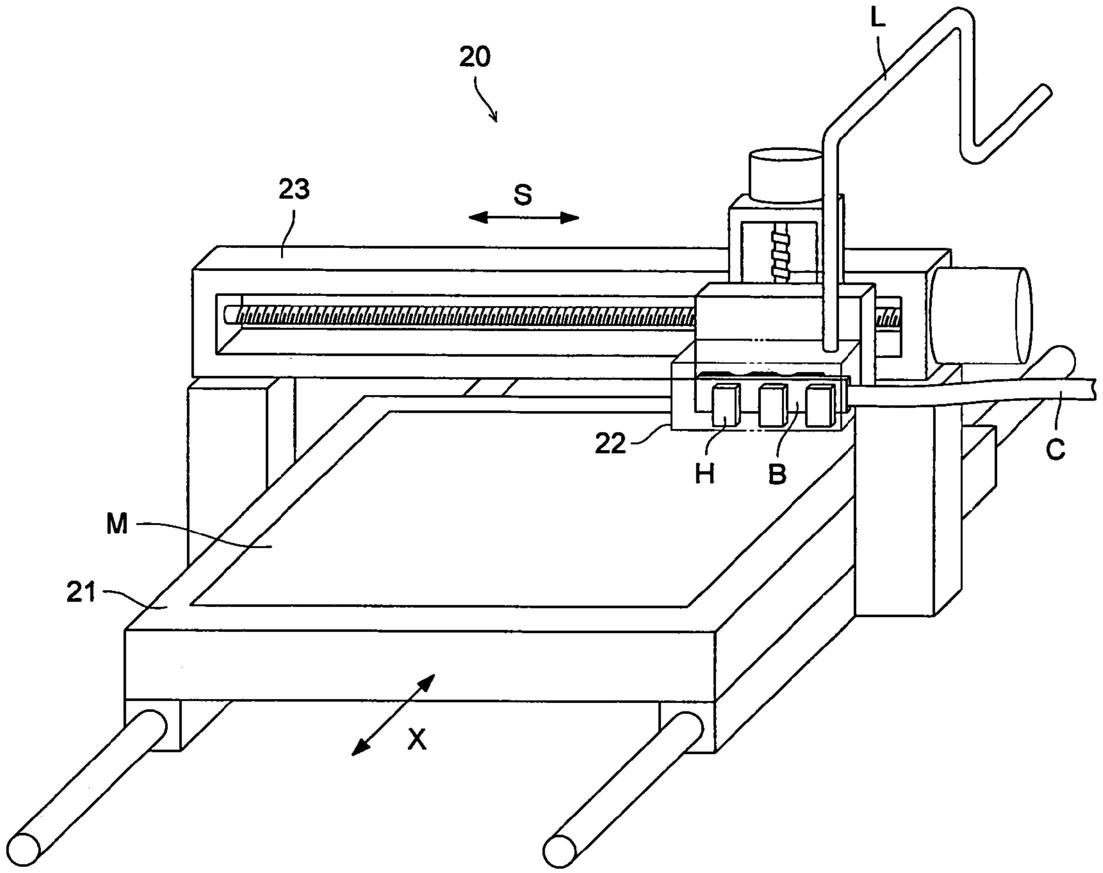
FIG. 10 is an exterior view of the recording apparatus which uses a method for detecting the interval of the recorded positions relating to an embodiment of the present invention.
Figure 11:
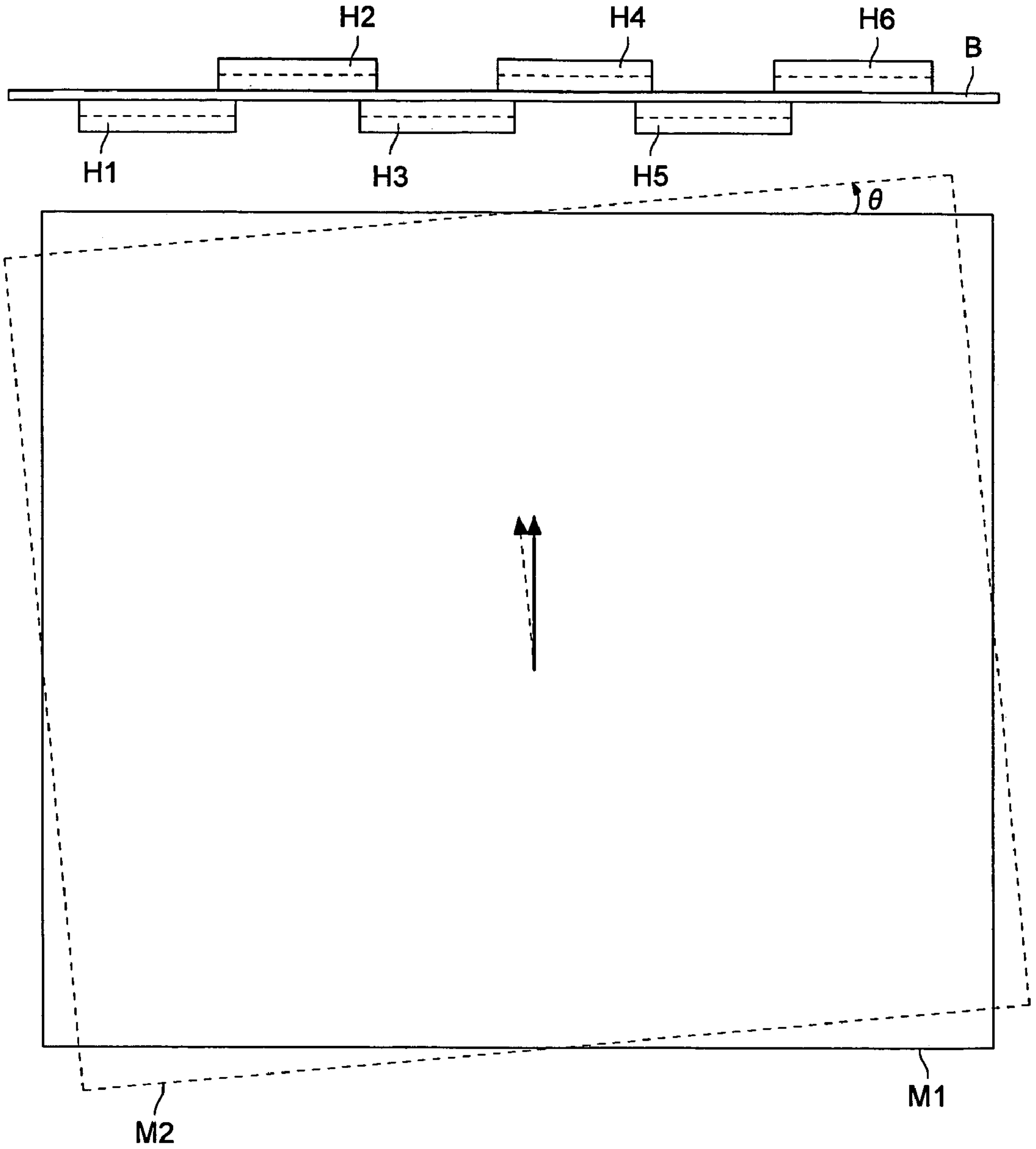
FIG. 11 shows the relationship between the recording heads and the recording medium on the recording apparatus of FIG. 10.
Figure 12:
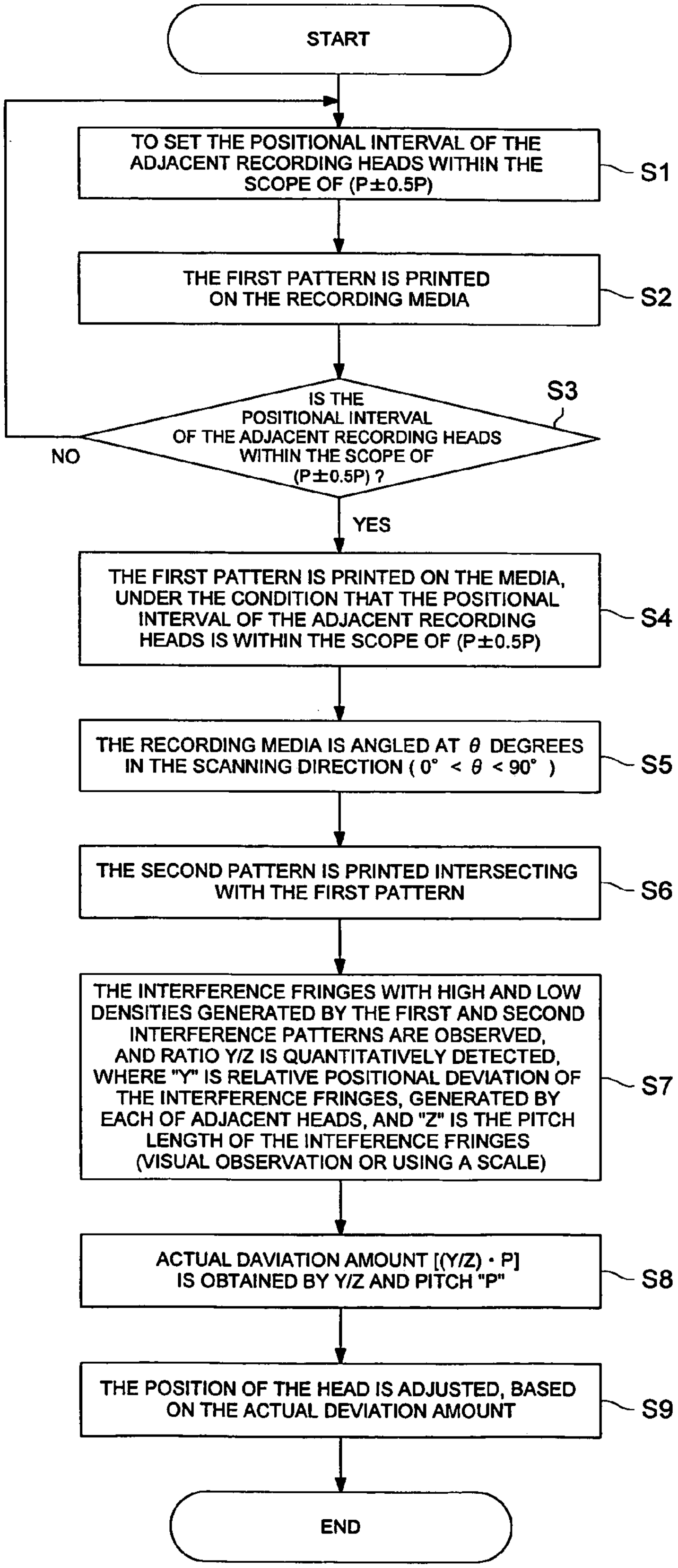
FIG. 12 is a flow chart of a method for detecting the interval of the recorded positions relating to an embodiment of the present invention.

FIG. 10 shows an example of the recording apparatus which is able to use the present method. Recording apparatus 20 is provided with conveyance stage 21 which is movable in main scanning direction X, carriage 22, and driving device 23 which drives carriage 22 in sub-scanning direction S. Recording medium M is placed on conveyance stage 21. Carriage 22 includes six pieces of inkjet recording heads H. Signal cable C is connected to each recording head H through circuit board B. Further, ink supplying tube L is connected to each recording head H. FIG. 11 is a top view of recording medium M. As shown in FIG. 11, the recording heads are represented by H1 to H6. FIG. 12 shows an operational flow of the present method.

Step S1: Each recording head H is placed so that intervals between recorded positions via the adjacent recording heads (H1 and H2, H2 and H3, H3 and H4, H4 and H5, and H5 and H6) can be set within the scope of (P±0.5 P).

Step S2: Recording medium M is placed on conveyance stage 21 as shown by M1 in FIG. 11, on which recording device 20 records the first pattern. Recording device 20 activates all recording heads H1 to H6 so that the first pattern can be recorded on recording medium M.

Step S3: The intervals in the first pattern printed on recording medium M are measured, and it is checked whether the intervals between recorded positions via the adjacent recording heads (H1 and H2, H2 and H3, H3 and H4, H4 and H5, and H5 and H6) are set within the scope of (P±0.5 P).

If they are out of the scope, the position of the recording head is re-adjusted, and steps S1 to S3 are repeated.

If they are set within the scope, the process advances to the next step.

Step S4: The first pattern is printed on the condition that the intervals between recorded positions via the adjacent recording heads (H1 and H2, H2 and H3, H3 and H4, H4 and H5, and H5 and H6) are set within the scope of (P±0.5 P). In addition, if this pattern has been printed in Step 3, this pattern can be used again.

Step S5: Recording medium M is placed on conveyance stage 21 like the case of M2 being angled at θ (0°<θ<90°) against the case of M1 as shown in FIG. 11.

Step S6: Recording device 20 records the second pattern on recording medium M. Recording device 20 activates a single recording head H (H3 for example) so that the second pattern can be recorded on recording medium M. Due to this, the second pattern crosses the first pattern at θ degrees, and is printed on recording medium M.

Step S7: The interference fringes (see FIGS. 2,4 and 5), including high and low densities, produced by the first and second patterns are observed. The interference fringes with high and low densities generated by the first and second interference patterns are observed, and thereby, ratio Y/Z is quantitatively detected, where "Y" is relative positional deviation of the interference fringes, generated by each of the adjacent heads, and "Z" is the pitch distance of the interference fringes.

Step S8: Actual deviation amount [(Y/Z)×P] is obtained by ratio (Y/Z) and pitch P.

Step S9: The position of recording head H is corrected based on the actual deviation amount.

Next, an embodiment of the recording device of the present invention will be explained.

Figure 13:
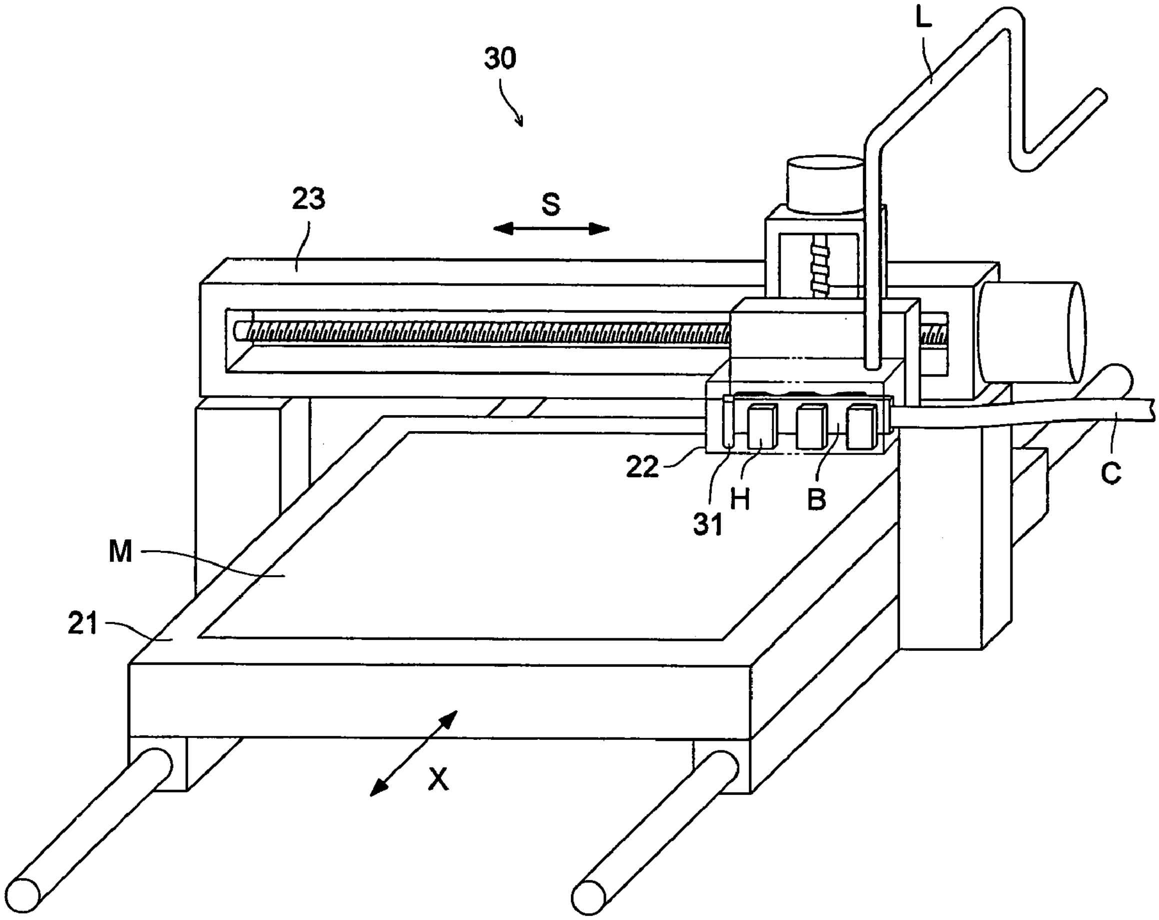
FIG. 13 is an exterior view of the recording apparatus which uses a means to read interference fringes relating to an embodiment of the present invention.

The recording device of the present invention includes not only every structure of inkjet recording device 20 shown in FIG. 10, but also a photo sensor as an element of a means for reading the interference fringes. FIG. 13 shows an outline view of recording device 30 of the present embodiment. Photo sensor 31 as well as recording head H is mounted on carriage 22 in FIG. 13.

Figure 14:
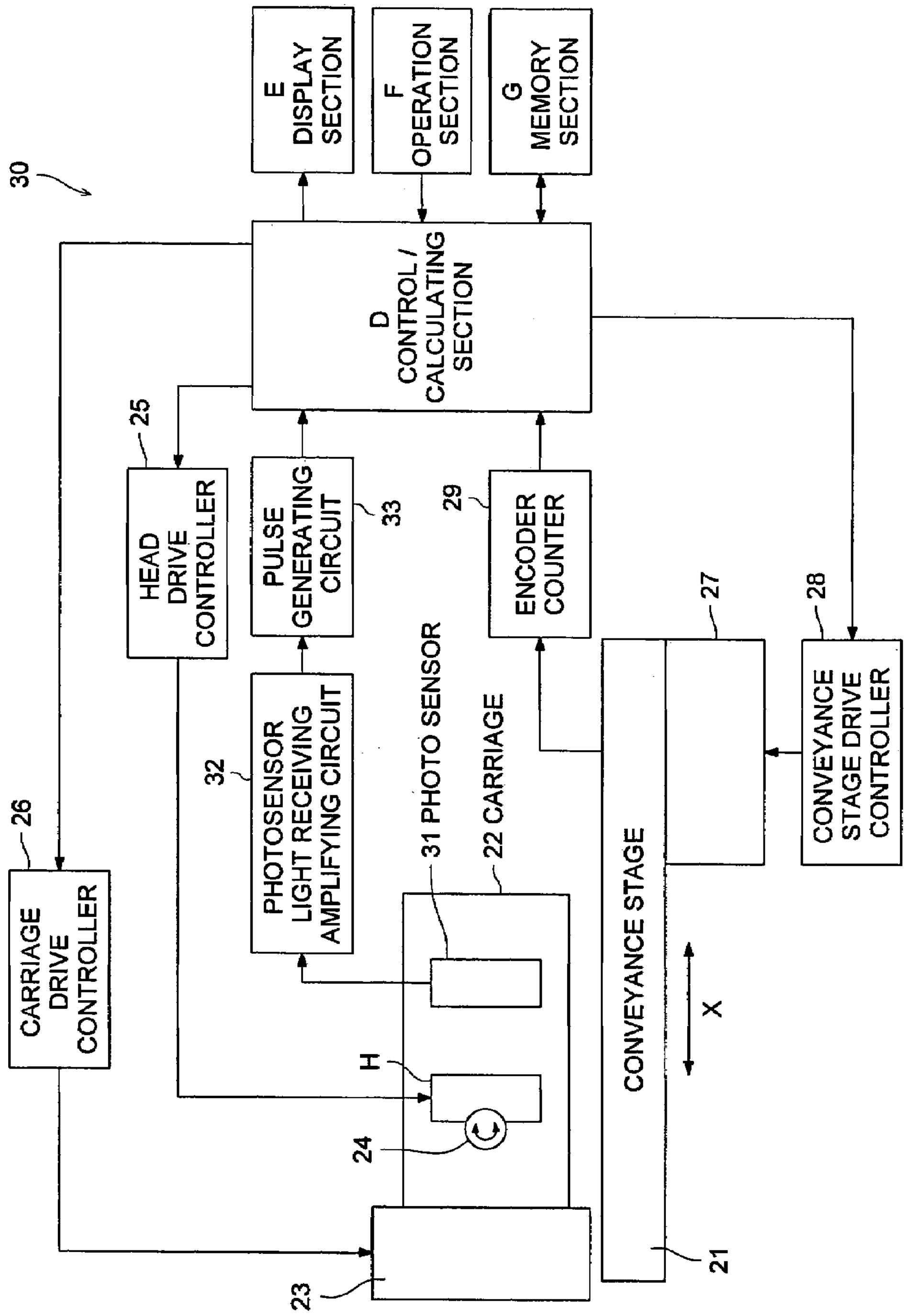
FIG. 14 is a block chart of the recording apparatus which uses a means to read interference fringes relating to an embodiment of the present invention.

As shown in a block diagram in FIG. 14, recording device 30 includes control/calculating section D, display section E, operation section F, memory section G, recording head H, head position adjusting mechanism 24, head drive controller 25, carriage 22, carriage driving device 23 which drives carriage 22 in sub-scanning direction S, carriage drive controller 26, conveyance stage 21, conveyance stage driving device 27, conveyance stage drive controller 28, encoder counter 29, photo sensor 31, photo sensor light receiving amplifying circuit 32 and pulse generating circuit 33.

Control/calculating section D is structured of ICs which carry out the pre-written programs. Control/calculating section D controls each section to perform the recording operation or reading operation of the interference fringes, and further, calculates the position of the interference fringes. That is, control/calculating section D works as a means for controlling the recording operation, controlling the interference fringes reading means and calculating the position of the interference fringes.

Memory section G stores the image data of the first patterns and the second patterns.

Control/calculating section D timely reads out the image data from memory section G, and controls each section, in accordance with the operation signals inputted from operation section F by the operator, and allows each section to record the patterns and read out the interference fringes, and thereby carries out required calculating operation.

Display section E displays the operation guides and the measured results of the interference fringes.

While recording the patterns, control/calculating section D inputs the image signals into head drive controller 25, which applies the driving voltages to recording head H based on the inputted image signals. Thus, control/calculating section D controls recording heads H via head drive controller 25.

In the same ways as above, control/calculating section D controls conveyance stage driving device 27 via conveyance stage drive controller 28, and thereby movement of conveyance stage 21 is controlled. By the movement of conveyance stage 21, control/calculating section D allows recording heads H to scan in main scanning direction X during pattern recording, and also allows photo sensor 31 to scan in main scanning direction X during reading interference fringes.

Based on the movement of conveyance stage 21, moving distance is outputted from encoder counter 29 at a predetermined encoder resolution, and is inputted into control/calculating section D so that control/calculating section D reads the position of conveyance stage 21.

Further, control/calculating section D controls carriage driving device 23 via carriage drive controller 26, and thereby controls movement of carriage 22. By the movement of carriage 22, control/calculating section D moves recording heads H in sub-scanning direction S during pattern recording, and also moves photo sensor 31 in sub-scanning direction S during reading interference fringes.

Reflection type photo sensor 31 receives the light rays reflected on recording medium M, and converts the received light rays based on light and darkness on recording medium M, to electrical signals. In order to precisely detect the variation of light and darkness of interference fringes, the detecting scope of photo sensor 31 is preferably greater than pitch P of the recorded pattern, and is more preferably greater than the scope which is several times pitch P.

Outputted signals from photo sensor 31 are amplified by photo sensor light receiving amplifying circuit (hereinafter, referred to as "amplifier 32"). FIG. 15(*a*) shows photo sensor 31 and the circuit diagram of amplifier 32. FIG. 15(*b*) shows the waveforms of the outputted signals from amplifier 32. Outputted value $V_o$ from amplifier 32 is inputted into pulse generating circuit 33. Pulse generating circuit 33 divides outputted value $V_o$ into two values, being ON and OFF, by predetermined threshold value TH, and generates the pulse waves as shown in FIG. 15(*c*). The waveforms shown in FIGS. 15(*b*) and 15(*c*) are examples which are detected when photo sensor 31 scans the interference fringes. The values change high and low in accordance with the changed positions of the stage, while the interference fringes are scanned.

Head position adjusting mechanism 24 incorporates the same structure as that of a micrometer surveying instrument to precisely adjust the position of each recording head H in sub-scanning direction S.

Next, the operation for recording the first and second pattern, and the operation for reading interference fringes will be detailed. In the following operation, the second pattern is recorded firstly, and only recording head H3 is operated for recording the second pattern.

Figure 16:
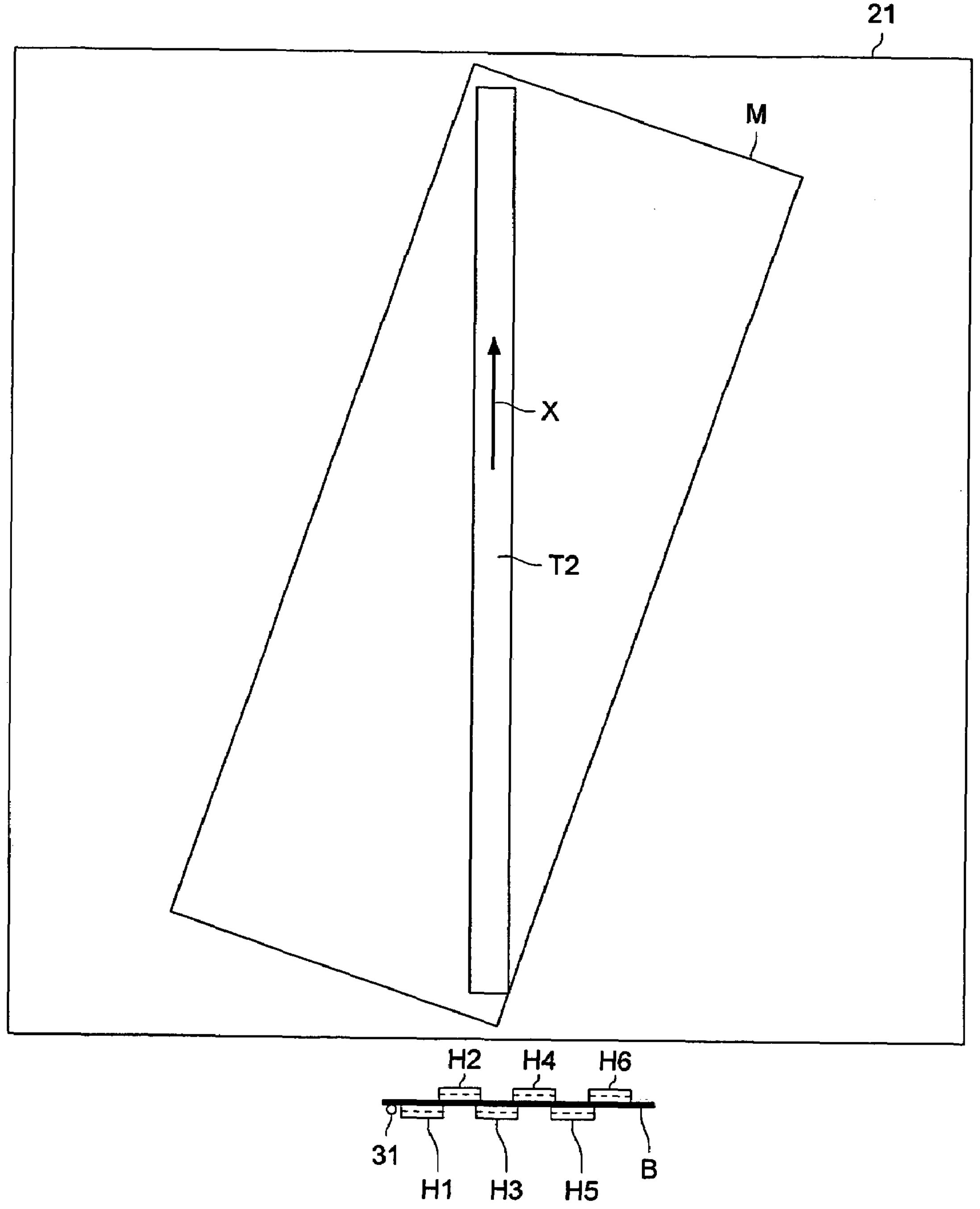
FIG. 16 is a plan view showing the positional relationship between the recording medium on a conveyance stage and the recording heads, for recording the second pattern.

As shown in FIG. 16, recording medium M is placed on conveyance stage 21, then recording head H3 records second pattern T2 on recording medium M.

Figure 17:
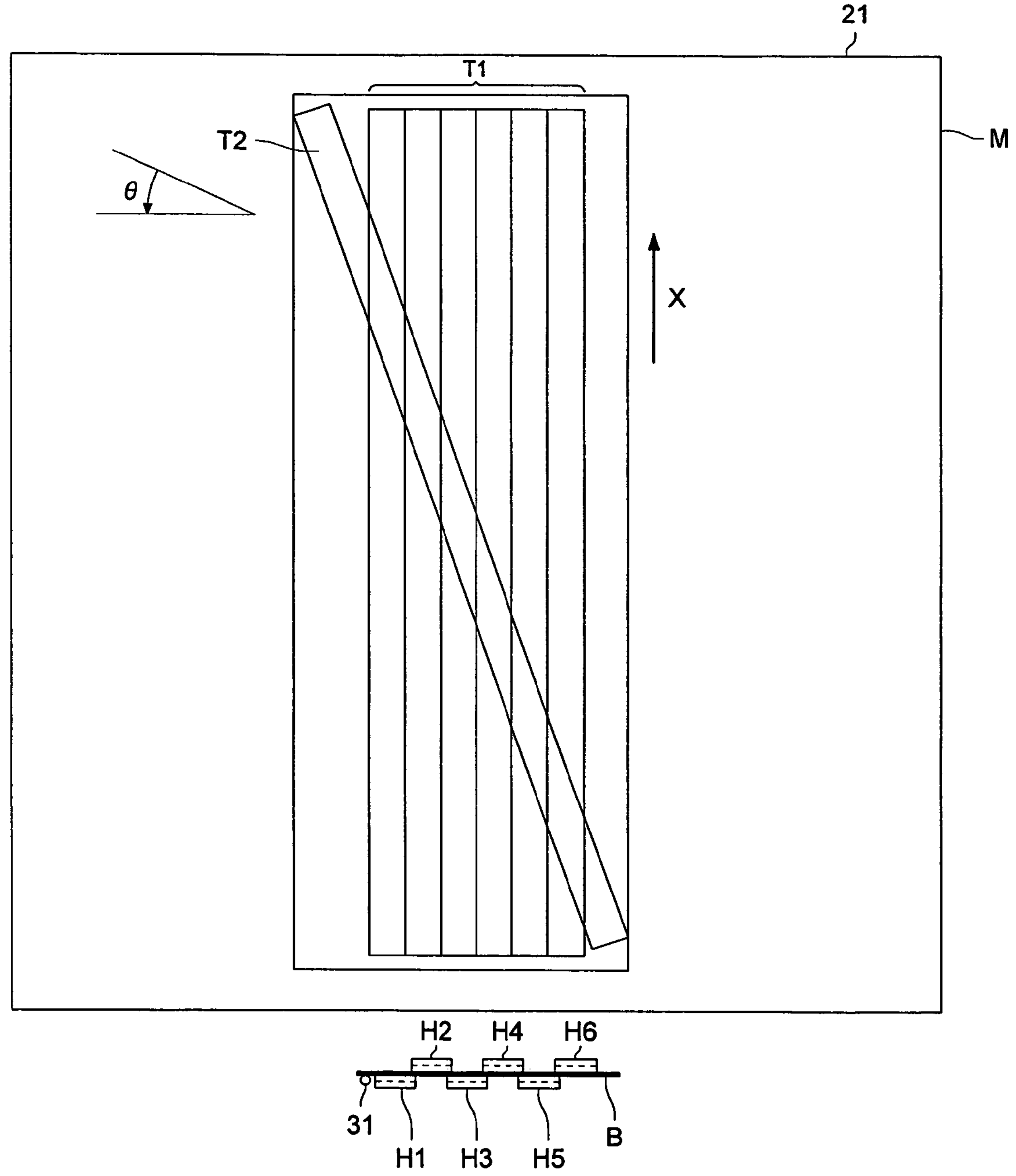
FIG. 17 is a plan view showing the positional relationship between the recording medium on a conveyance stage and the recording heads, for recording the first pattern.

Next, as shown in FIG. 17, after recording medium M is rotated by angle θ and placed again, all recording heads H1-H6 are operated to record first pattern T1 on recording medium M, and the recording operation is completed.

Figure 18:
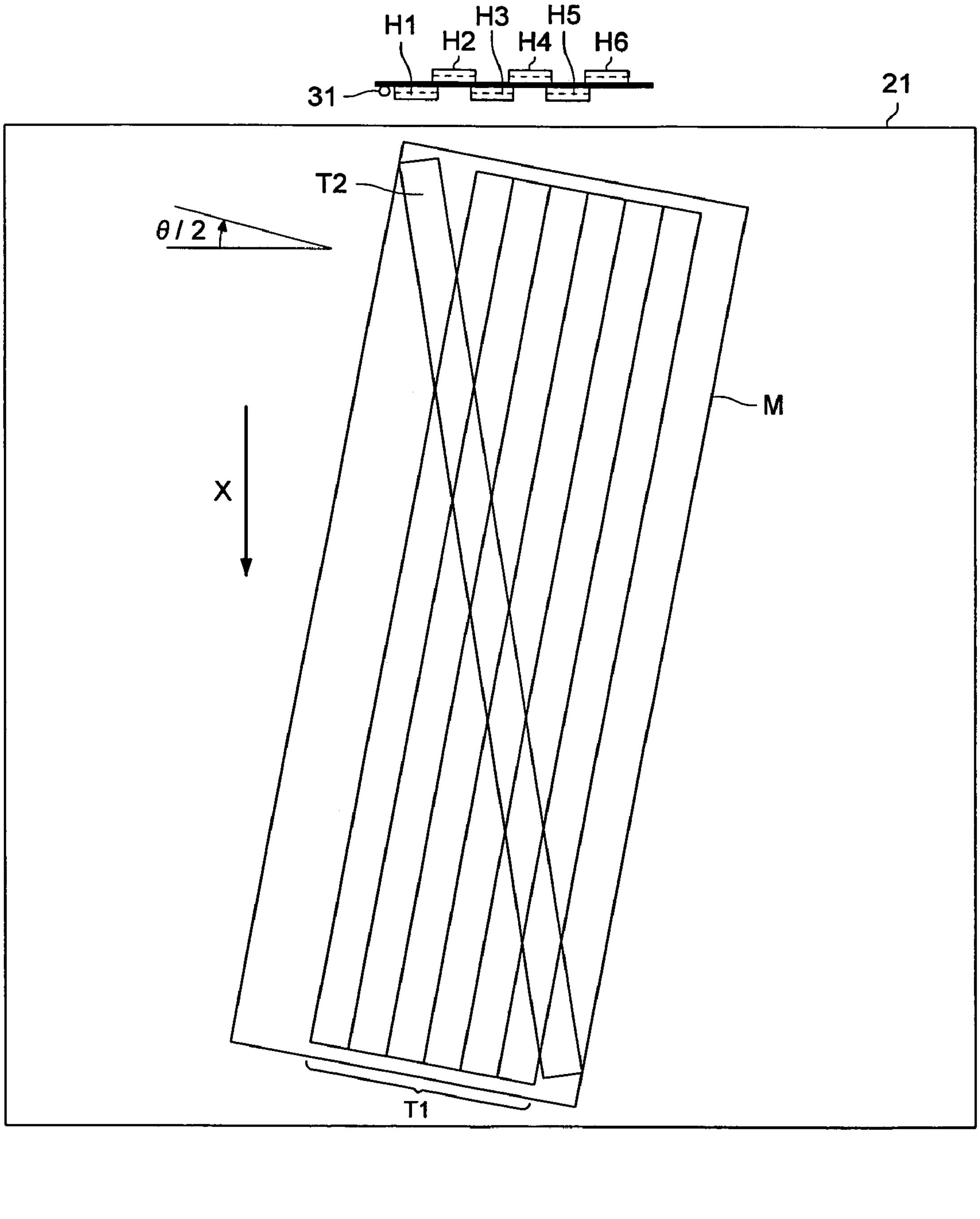
FIG. 18 is a plan view showing the positional relationship between the recording medium on a conveyance stage and the recording heads, for reading interference fringes.

Next, as shown in FIG. 18, to read interference fringes, recording medium M is rotated backward by angle θ/2 and placed again. Then interference fringes are positioned perpendicular to main scanning direction X.

Recording medium M in FIGS. 16, 17 and 18 are required to be precisely placed so that a machine can detect interference fringes, differing from the case of reading by a person. The following methods are effective to precisely place recording medium M. One method is to print marks by oil-based ink or to punch marks on conveyance stage 21, and thereby the corner or edges of recording medium M are precisely placed using the marks as a guide. Since these marks must be provided on three placements shown in FIGS. 16-18, the marks of the three cases must be distinguished individually.

The other method is that a turn table, as well as a driving mechanism, such as a stepping motor, is provided so that recording medium M mounted on the turn table can rotate at least for angle θ by the control conducted by control/calculating section D.

Further, the position of photo sensor 31, corresponding to recording head H, is previously determined, as well as the three different placements of recording medium M in FIGS. 16-18 are also determined. In addition, a movement control program of carriage 22 is formed in which the positions of first and the second patterns T1 and T2 and the position of photo sensor 31 are given, and this program is written in control/calculating section D as a part of a program for reading interference fringes. Still further, photo sensor 31 is fixed at the determined position.

Figure 19:
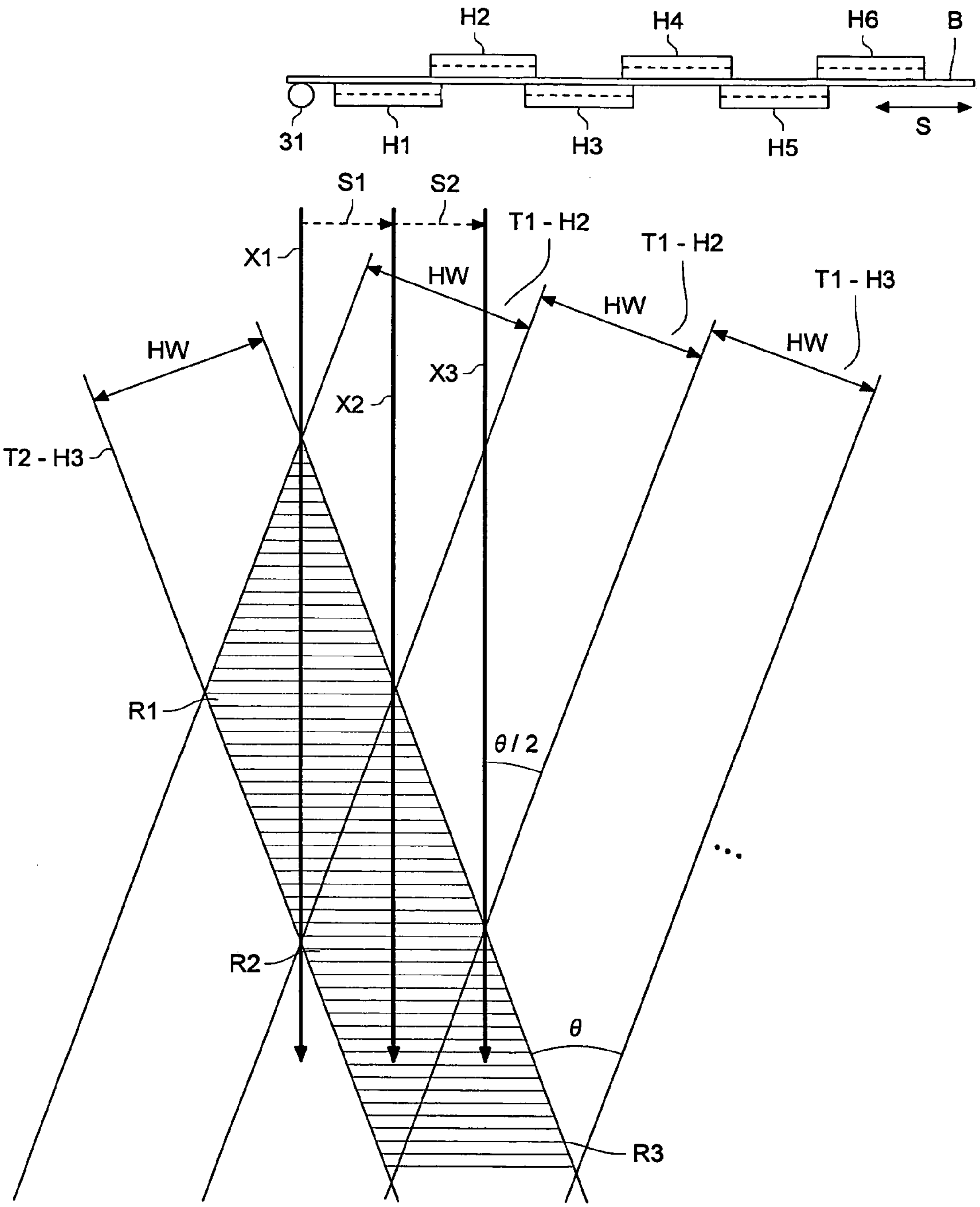
FIG. 19 is an enlarged plan view of a part in FIG. 18.

After three placements of recording medium M, shown in FIG. 16-18, are precisely carried out, control/calculating section D controls the position of carriage 22 based on the program, and thereby the positions of first and second patterns T1 and T2 and photo sensor 31 can be shown in an enlarged drawing, as shown in FIG. 19. In FIG. 19, T1-H1 shows the first pattern formed by recording head H1, T1-H2 shows the first pattern formed by recording head H2, T1-H3 shows the first pattern formed by recording head H3, and T2-H3 shows the second pattern formed by recording head H3, each having recording width HW. R1, R2, R3 . . . show overlapped areas of the first and second patterns formed by each recording head.

Next, control/calculating section D controls the operation for reading interference fringes. Firstly control/calculating section D controls the position of carriage 22 to place photo sensor 31 on scanning line X1. Scanning lines X1, X2, X3, . . . represent the scanning lines passing through the center of overlapping areas R1, R2, R3, . . . . Sub-scanning amounts S1, S2, S3, . . . represent a distance to the adjacent scanning line. The theoretical amount of sub-scanning amounts S1, S2, S3, . . . are shown by $\{HW\cdot(1/\sin\theta)\cdot(\sin\theta/2)\}$.

Next, control/calculating section D controls conveyance stage 21 and carriage 22 to move so that photo sensor 31 scans scanning lines X1, X2, X3, . . . . Then photo sensor 31 receives the light rays reflected on overlapping areas R1, R2, R3, . . . . Using the received light rays, pulse generating circuit 33 generates the pulse waves, and the pulse waves are received by control/calculating section D as original data for calculation. Since errors exist in the placements of recording media M, the control program should be designed to sample the wave forms when photo sensor 31 scans central sections of overlapping areas R1, R2, R3, . . . .

Next, a constant position, a central position of the wave form for example, is specified based on positional information outputted from encoder counter 29, that is, the constant position is a basis for the pulse waves which control/calculating section D has obtained. The constant position is calculated as a numerical value for showing the position of interference fringes. Control/calculating section D outputs the numerical value for showing the position of interference fringes at overlapping areas R1, R2, R3, . . . on display section E.

It is possible to detect the position of interference fringes at various S coordinates in a single overlapping area, and further calculating the average from the positions of the detected interference fringes, to be outputted. In this case, the numerical value showing the positions of interference fringes becomes more accurate. Further, it is also possible to read the positions of interference fringes at various S coordinates in a single overlapping area, and to directly output them. Spread of the outputted data shows the spread of a recording position in a single recording head, which teaches whether the recording head can be used.

However, numerical values not greater than one pitch of deviation of the adjacent recorded positions can only be read from interference fringes. For example, in the case of a 1.8 pitch deviation, when the position of the recording head is corrected via reading interference fringes, the deviation becomes 2.0 pitches. Accordingly, before recording the first and second patterns to generate interference fringes, each recording head should be placed so that the interval of the adjacent recorded positions of the adjacent recording heads can be set within the scope of (P±0.5 P). Depending on minuteness of a recorded pitch, it is possible to determine the interval visually or at the aim of a magnifying glass whether the interval is set within the scope of (P±0.5 P). For automatic detection, the following method is possible to use by which the recording apparatus itself can determine whether the interval is set within the scope of (P±0.5 P).

That is, as shown in FIGS. 20(*a*1) and (*b*1), photo sensor 31 scans first recorded pattern T1 in a such way that photo sensor 31 crosses the patterns printed by each recording elements, then the recording apparatus determines whether the interval is set within the scope of (P±0.5 P) via the output [see FIGS. 20(*a*2) and 20(*b*2)] from photo sensor 31.

FIGS. 20(*a*1) and 20(*b*1) show the jointed sections of first recorded patterns T1-H1 and T1-H2, recorded by adjacent recording heads H1 and H2. When the interval of said jointed section is greater than [see FIG. 20(*a*1)], or less than [see FIG. 20(*b*1)] the interval of the recorded positions in first recorded pattern T1-H1 and T1-H2, the sensor outputs include abnormal wave forms as shown in FIGS. 20(*a*2) and 20(*b*2). Control/calculating section D determines based on said abnormal wave forms whether the practical pitch is greater than (P±0.5 P) or not, and less than (P−0.5 P) or not. Control/calculating section D displays the result on display section E, or uses for an automatic adjustment of the placement of the recording head, to be described later.

Figure 21:
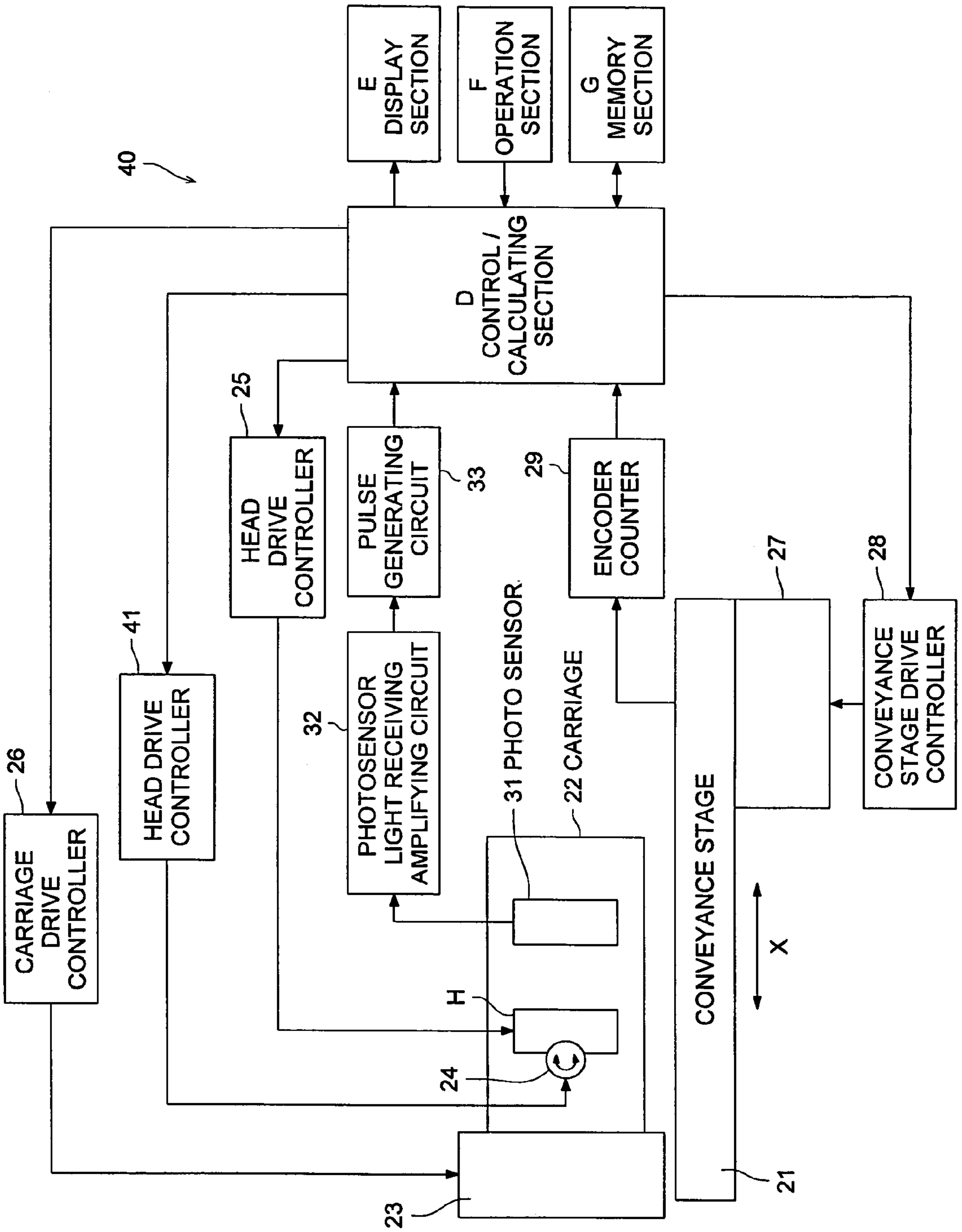
FIG. 21 is a block chart of a recording apparatus employing a position adjusting device to adjust the position of the recording head relating to an embodiment of the present invention.

Next to be explained is a recording apparatus employing a position adjustment device for adjusting the recording head. FIG. 21 is a block diagram of recording apparatus 40 employing the position adjustment device for adjusting the recording head. Recording apparatus 40 includes the functions as well as the structures described in the case of recording apparatus 30, and further includes a function to control head position adjusting mechanism 24 via head drive controller 41. This function incorporates an actuator, such as a stepping motor, for operating head position adjusting mechanism 24, on the carriage. An interface section for controlling the actuator is connected to control/calculating section D of recording apparatus 40.

After control/calculating section D determines whether the interval of said jointed section is greater than (P±0.5 P) or not, and less than (P−0.5 P) or not, if it is greater than (P+0.5 P), control/calculating section D controls head position adjusting mechanism 24 so that the adjacent recording heads are closely positioned, and if it is less than (P−0.5 P), control/calculating section D controls head position adjusting mechanism 24 so that the adjacent recording heads are positioned at a distance. If the interval of said joint section is set within the scope of (P±0.5 P), control/calculating section D adjust the position of the head based on interference fringes to be described later.

Control/calculating section D controls various sections and reads interference fringes, and calculates the numerical values showing the position of interference fringes, as mentioned above. Then control/calculating section D finely adjusts the individual head positions based on the numerical values showing the position of interference fringes.

That is, control/calculating section D calculates the correction adjustment amount of the head position, based on the numerical value, showing the position of interference fringes, and further, controls head position adjusting mechanism 24, to adjust the individual positions of recording heads.

In the detection method of the recorded position relating to the present invention, if the high density areas and low density areas are repeated at an equal pitch in the first recorded pattern group, and the high and low density areas are also repeated at an equal pitch in the second recorded pattern group, the interference fringes appear as straight lines. That is, if there is no change in the interval of the recorded position, the interference fringes appear as straight lines.

For this reason, according to the present invention, the change of intervals of the recorded positions can be read out by detecting any positional deviation of the interference fringes.

According to the recording apparatus relating to the present invention, the first pattern as well as the second pattern can be recorded on the cording medium, and further the position of the interference fringes generated by overlapping of the first pattern and the second pattern on the recording medium can be detected. Detection of the position of interference fringes can be applied to the evaluation or improvement of accuracy of the recorded matter.

What is claimed is:

1. A method for detecting a change of an interval of recorded positions recorded by a plurality of recording heads, each including an array of a plurality of recording elements, wherein the plurality of the recording heads are straightly aligned in direction of the array comprising the steps of:

recording a first pattern group in such a way that the recording heads scan a recording medium so that the recording elements in the recording heads record a pattern having repeatedly dark dens it area and light density area pependicuiar to a scanning direction at the recording heads as a first recording operation;

recording a second pattern group in such a way that after the recording medium is angled in the scanning direction after the first pattern group is recorded the recording heads scan the recording medium so that the recording elements record a pattern having repeatedly dark density area and light density area perpendicular to the scanning direction of the recording heads so that the second pattern group is overlapped on and angled to the first pattern group as a second recording operation;

detecting interference fringes generated by an overlap of the first pattern group and the second pattern group; and detecting the change of the interval of the recorded positions via a positional deviation of the interference fringes.

2. The method for detecting the interval of recorded positions of claim 1, for recording the first pattern group and the second pattern group, a single activated recording element records a single straight line so that a plurality of activated recording elements record a plurality of lines being parallel to each other, and the plurality of lines are equal in number to a plurality of activated recording elements.

3. The method for detecting the interval of recorded positions of claim 1, wherein the second pattern is recorded by a single recording head.

4. The method for detecting the interval of recorded positions of claim 1, wherein a ratio of the positional deviation of the interference fringes to a single pitch of the interference fringes is detected as a ratio of a changed amount of the interval of the recorded position to a single pitch of the recorded position.

5. A recording apparatus, comprising:

a plurality of recording heads, each including an array of a plurality of recording elements, wherein the plurality of recording heads are straightly aligned in a direction of the array;

a recording operation control section for recording a first pattern group in such a way that the plurality of recording heads scan a recording medium so that the plurality of recording elements in the recording heads record a pattern having repeatedly dark density area and light density area perpendicular to a scanning direction as a first recording operation and for recording a second pattern group in such a way that after the recording medium is angled in the scanning direction after the first pattern group is recorded the recording heads scan the recording medium so that recording elements record a pattern having repeatedly dark density area and light density area perpendicular to the scanning direction and further the second pattern group is overlapped on and angled to the first pattern group as a second recording operation; and an interference fringes detecting section for detecting interference fringes generated by an overlap of the first pattern group and the second pattern group.

6. The recording apparatus of claim 5, wherein the interference fringes detecting section detects positions of the interference fringes at plural different positions in directions of interference fringes.

7. The recording apparatus of claim 5, wherein the interference fringes detecting section detects the position of interference fringes generated by overlapping of the first pattern recorded by a certain recording head and the second pattern, and the position of the interference fringes generated by overlapping of the first pattern recorded by another certain recurding head adjacent to the certain recording head and the second pattern.

8. The recording apparatus of claim 7, further comprising a position adjusting device which adjusts a position of the recording head based on positional information detected by the interference fringes detecting section.

9. The recording apparatus of claim 5, wherein the interference fringes detecting section includes:

a sensor section being able to detect variation of dark and light density of interference fringes;

a scanning section for making the sensor to scan the recording medium in the main scanning direction and the sub-scanning direction;

an encoder section which outputs relative moving distance of the sensor section and the recording medium scanned by the sensor section at a predetermined encoder resolution; and a calculating section for calculating the position of interference fringes, wherein the calculating section creates numerical information of the position of interference fringes.

10. The recording apparatus of claim 5, wherein the plurality of recording heads are aligned perpendicular to the scanning direction, but offset.

11. The recording apparatus of claim 5, wherein the plurality of recording heads are obliguely aligned perpendicular to the scanning direction, and parallel to each other.

* * * * *